United States Patent
Kim

(10) Patent No.: US 12,520,481 B2
(45) Date of Patent: Jan. 6, 2026

(54) SEMICONDUCTOR DEVICE INCLUDING VERTICAL CHANNEL STRUCTURE

(71) Applicant: SAMSUNG ELECTRONICS CO., LTD., Suwon-si (KR)

(72) Inventor: Kijoon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 483 days.

(21) Appl. No.: 18/118,560

(22) Filed: Mar. 7, 2023

(65) Prior Publication Data

US 2023/0301067 A1    Sep. 21, 2023

(30) Foreign Application Priority Data

Mar. 17, 2022  (KR) .................. 10-2022-0033487

(51) Int. Cl.
  *H10B 12/00*  (2023.01)
(52) U.S. Cl.
  CPC .......... *H10B 12/315* (2023.02); *H10B 12/05* (2023.02); *H10B 12/482* (2023.02); *H10B 12/50* (2023.02)
(58) Field of Classification Search
  CPC .......... H01D 30/6278; H01D 30/6755; H01D 30/6757; H10B 12/315; H10B 12/48
  See application file for complete search history.

(56) References Cited

U.S. PATENT DOCUMENTS 8,890,159 B2    11/2014  Yamazaki et al.
8,952,381 B2    2/2015   Yamazaki
(Continued)

FOREIGN PATENT DOCUMENTS

KR    10-2015-0038279 A    4/2015
KR    10-2020-0076343 A    6/2020
(Continued)

OTHER PUBLICATIONS

Saito, N., et al., "High-Mobility and H2-Anneal TolerantInGaSiO—InGaZnO—InGaSiO Double Hetero Channel Thin Film Transistor for Si-LSI Compatible Process" Journal of the Electron Devices Society, vol. 6, (2018), pp. 500-505, 6 pages. doi: 10.1109/EDTM.2017.7947542.

(Continued)

*Primary Examiner* — Steven M Page
(74) *Attorney, Agent, or Firm* — Sughrue Mion, PLLC

(57) ABSTRACT

A semiconductor device is provided. The semiconductor device includes: a lower structure including bit lines; an intermediate structure including vertical channel structures and gate structures; and an upper structure including a data storage structure. A first channel structure among the vertical channel structures includes a lower portion, and first and second vertical portions extending upwardly from sides of the lower portion. The gate structures include first and second gate structures on the lower portion between the first vertical portion and the second vertical portion. The first gate structure is in contact with the first vertical portion. The second gate structure is in contact with the second vertical portion. The first channel structure includes a plurality of layers. At least one of the plurality of layers is an oxide semiconductor layer or a two-dimensional (2D) material layer having an energy band gap of about 1.2 eV or greater.

20 Claims, 20 Drawing Sheets

(56) References Cited

U.S. PATENT DOCUMENTS

| | | | |
|---|---|---|---|
| 9,537,478 B2 | 1/2017 | Takahashi | |
| 2011/0210378 A1* | 9/2011 | Ueno | H10D 30/015 |
| | | | 257/E21.403 |
| 2013/0069052 A1* | 3/2013 | Sandhu | H10B 12/03 |
| | | | 257/E27.084 |
| 2015/0179815 A1 | 6/2015 | Ahmed | |
| 2018/0350829 A1 | 12/2018 | Tezuka et al. | |
| 2019/0067326 A1* | 2/2019 | Huang | H10D 62/40 |
| 2019/0109199 A1 | 4/2019 | Yao et al. | |
| 2020/0203534 A1 | 6/2020 | Park et al. | |
| 2021/0143284 A1* | 5/2021 | Karda | H10D 30/6728 |
| 2021/0193801 A1* | 6/2021 | Wang | H10D 64/01 |
| 2021/0305431 A1* | 9/2021 | Ishimaru | H10D 30/6755 |
| 2022/0102539 A1* | 3/2022 | Hwang | H10D 30/477 |
| 2023/0069273 A1* | 3/2023 | Chen | H10D 30/024 |
| 2023/0301067 A1* | 9/2023 | Kim | H10B 12/31 |

FOREIGN PATENT DOCUMENTS

| | | |
|---|---|---|
| KR | 10-2161077 B1 | 9/2020 |
| KR | 10-2020-0143113 A | 12/2020 |

OTHER PUBLICATIONS

Li, Y., et al., "Performance Enhancement of Transparent Amorphous IGZO Thin-Film Transistor Realized by Sputtered Amorphous AlOx Passivation Layer", (2021) ECS Journal of Solid State Science and Technology, vol. 10, 045006, 11 pages.

Office Action issued Oct. 10, 2025 by the Korean Patent Office for KR Patent Application No. 10-2022-0033487.

* cited by examiner

SEMICONDUCTOR DEVICE INCLUDING VERTICAL CHANNEL STRUCTURE

CROSS-REFERENCE TO RELATED APPLICATION

This application claims priority to Korean Patent Application No. 10-2022-0033487 filed on Mar. 17, 2022 in the Korean Intellectual Property Office, the disclosure of which is incorporated herein by reference in its entirety.

BACKGROUND

The present disclosure relates to a semiconductor device including a vertical channel structure and a manufacturing method thereof.

Research has been conducted to reduce the size of elements constituting semiconductor devices and to improve performance thereof. For example, research has been conducted to reliably and stably form elements with reduced sizes in DRAM.

SUMMARY

One or more embodiments provide a semiconductor device having improved electrical characteristics.

According to an aspect of an embodiment, a semiconductor device includes: a lower structure including bit lines; an intermediate structure on the lower structure, and including a plurality of vertical channel structures and a plurality of gate structures; and an upper structure on the intermediate structure and including a data storage structure. A first channel structure among the plurality of vertical channel structures includes a lower portion, a first vertical portion extending upwardly from a first side of the lower portion, and a second vertical portion extending upwardly from a second side of the lower portion. The plurality of gate structures include a first gate structure and a second gate structure on the lower portion of the first channel structure between the first vertical portion and the second vertical portion. The first gate structure is in contact with the first vertical portion. The second gate structure is in contact with the second vertical portion. The first channel structure includes a plurality of layers. At least one of the plurality of layers is an oxide semiconductor layer or a two-dimensional (2D) material layer having an energy band gap of about 1.2 eV or greater.

According to an aspect of an embodiment, a semiconductor device includes: a lower structure including a bit line extending in a first direction; an intermediate structure on the lower structure, and including a vertical channel structure and a gate structure; and an upper structure on the intermediate structure and including a data storage structure. The vertical channel structure includes a lower portion and a vertical portion extending upwardly from a side of the lower portion. The gate structure is on the lower portion, and includes a gate electrode extending in a second direction, perpendicular to the first direction, and a gate dielectric layer between the gate electrode and the vertical portion. The vertical channel structure includes a first layer and a second layer. The first layer is a first oxide semiconductor layer or a two-dimensional (2D) material layer having an energy band gap of about 1.2 eV or greater. The second layer is a metal oxide layer or a second oxide semiconductor layer having a composition different from that of the first oxide semiconductor layer of the first layer.

According to an aspect of an embodiment, a semiconductor device includes: a lower structure including a bit line; an intermediate structure on the lower structure, and including a vertical channel structure and a gate structure in contact with a side surface of the vertical channel structure; and an upper structure on the intermediate structure and including a data storage structure. The gate structure includes a gate electrode and a gate dielectric layer between the gate electrode and the vertical channel structure. The vertical channel structure includes a first layer, a second layer and a third layer. The first layer and the second layer have different compositions.

BRIEF DESCRIPTION OF DRAWINGS

The above and other aspects and features will be more clearly understood from the following description, taken in conjunction with the accompanying drawings, in which.

DETAILED DESCRIPTION

Hereinafter, embodiments are described in conjunction with the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. Terms such as "upper", "middle" and "lower" may be replaced with other terms, for example, "first", "second" and "third" to describe the elements of the specification. Terms such as "first", "second" and "third" may be used to describe various elements, but the elements are not limited by the terms, and "first element" may be referred to as "second element".

Figure 1:
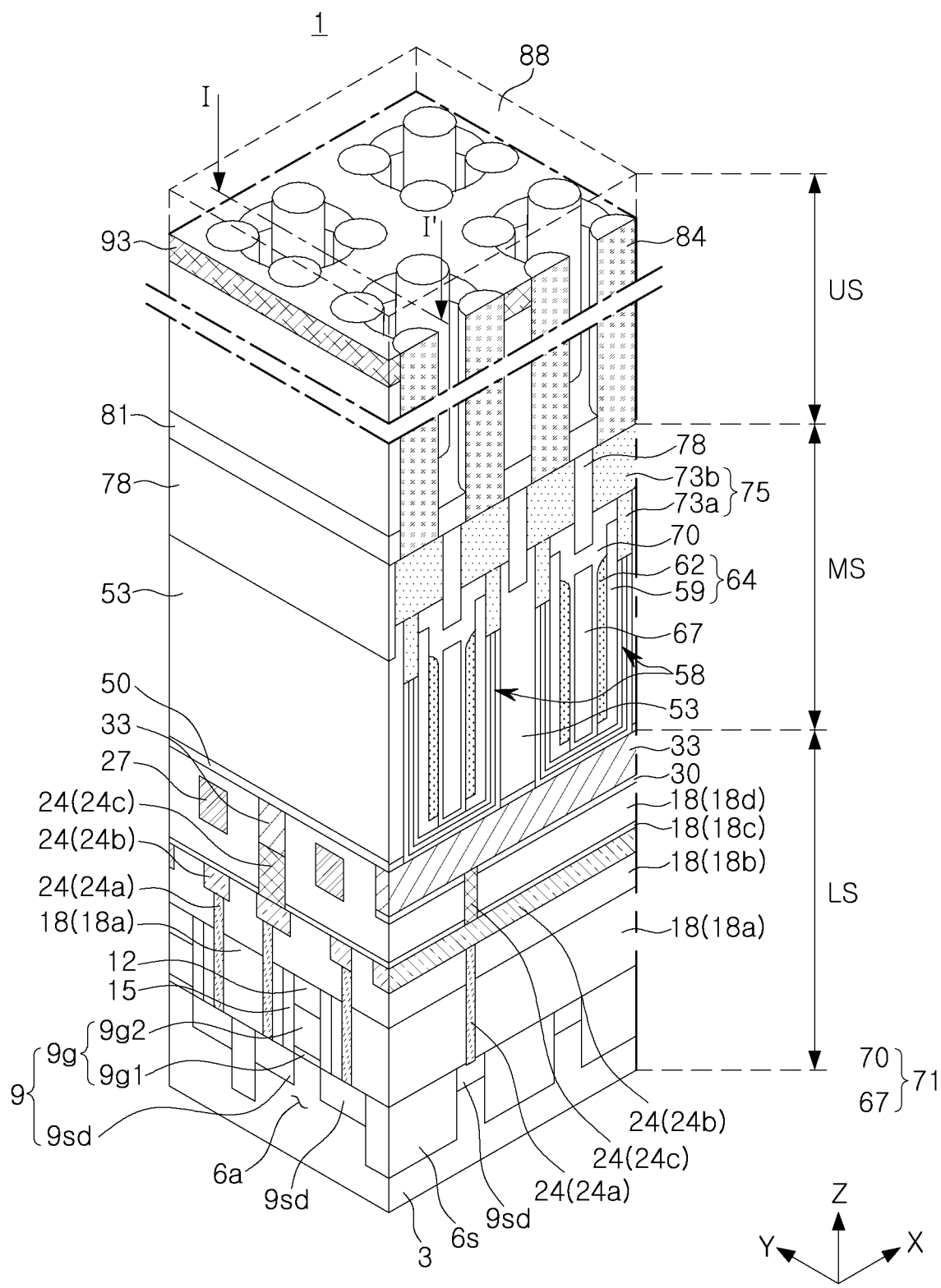
FIGS. 1, 2A, 2B, and 3 are diagrams schematically illustrating an example of a semiconductor device according to an embodiment.
Figure 2A:
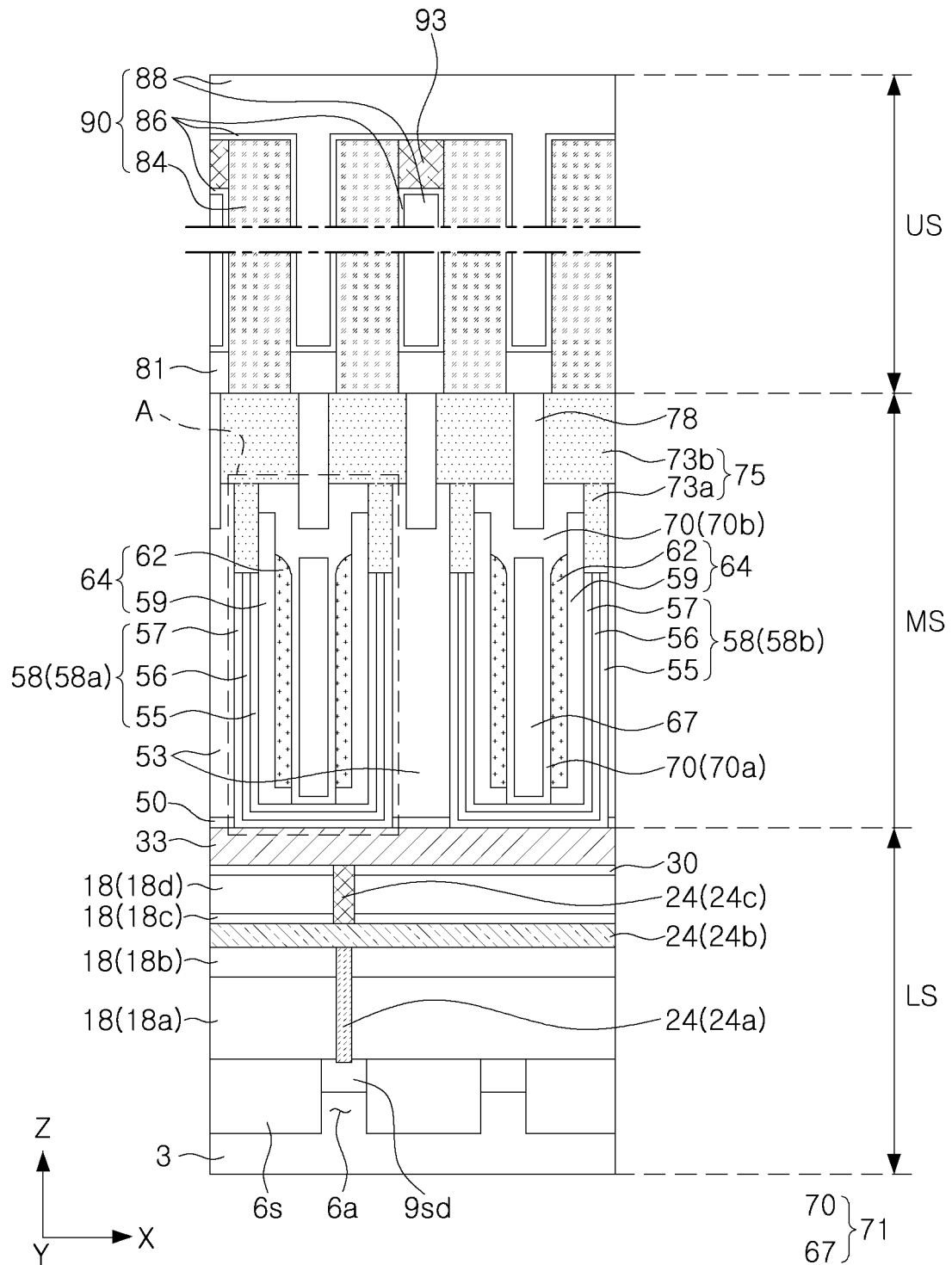
Figure 2B:
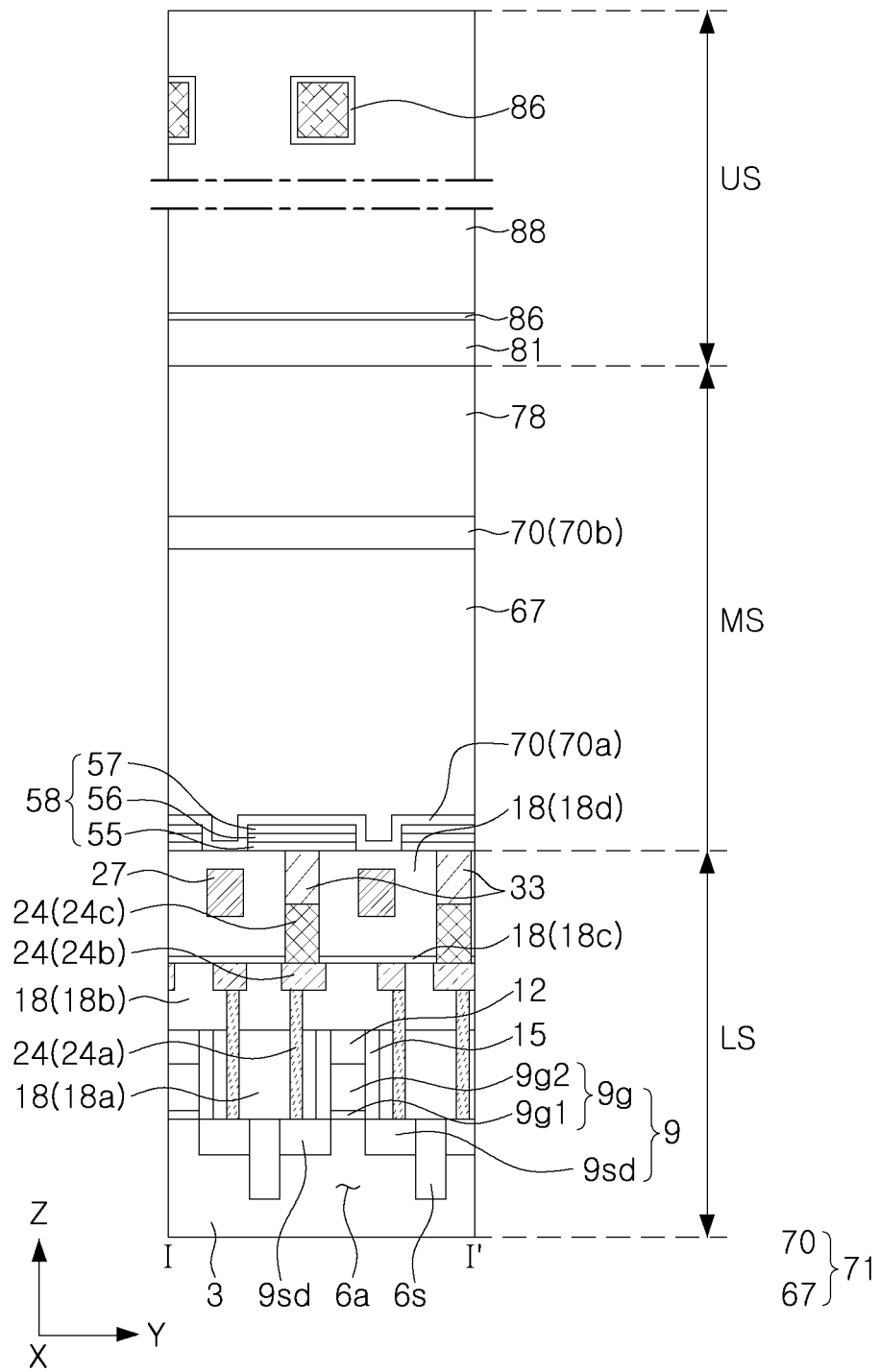
Figure 3:
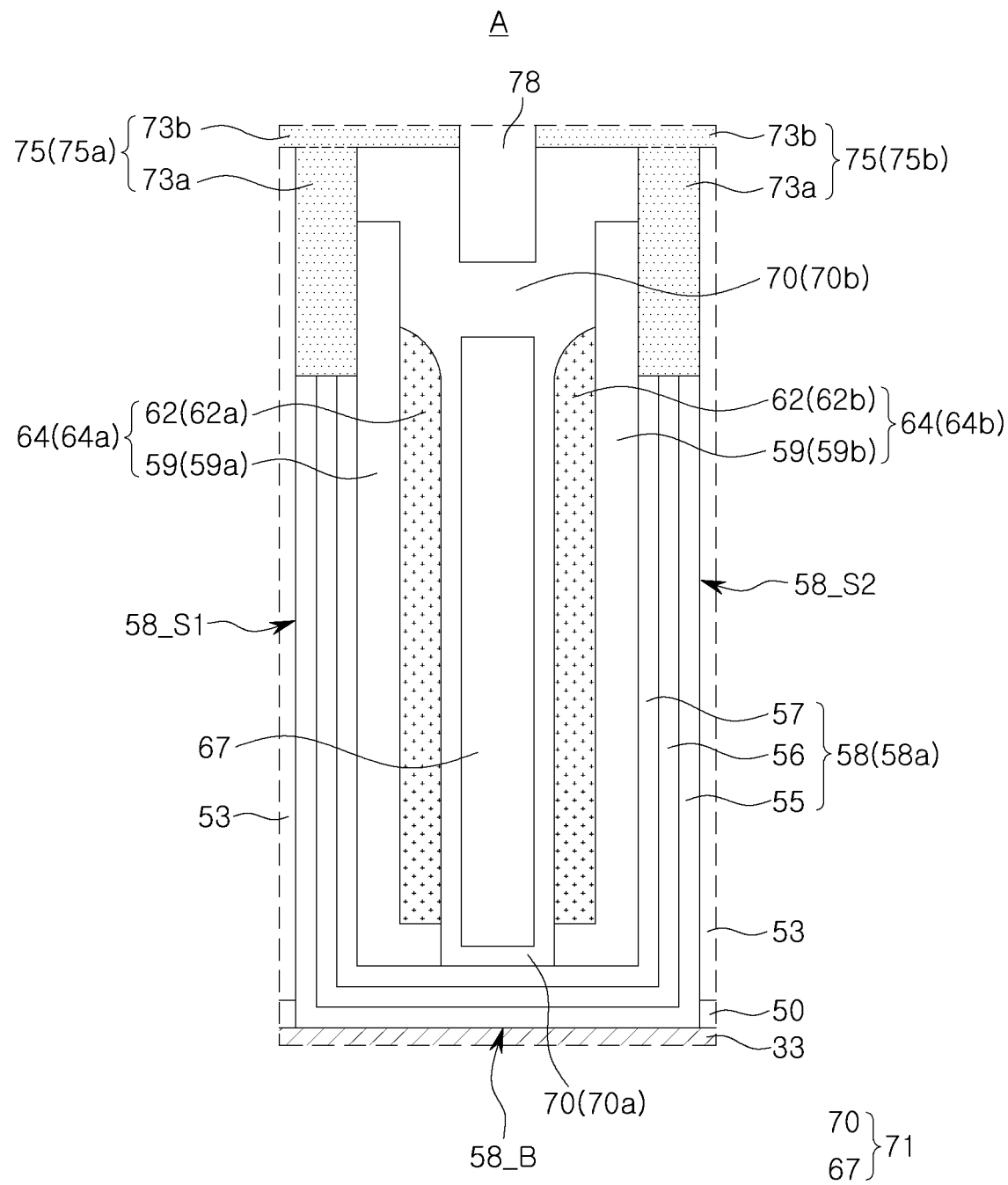

First, an example of a semiconductor device according to an embodiment will be described with reference to FIGS. 1, 2A, 2B and 3. FIGS. 1, 2A, 2B, and 3 are views schematically illustrating an example of a semiconductor device according to an embodiment, wherein FIG. 1 is a schematic view illustrating an example of a semiconductor device according to an embodiment, FIG. 2A is a cross-sectional view illustrating an X-Z plane shown in FIG. 1, FIG. 2B is a cross-sectional view illustrating the X-Z plane taken along line I-I' in FIG. 1, and FIG. 3 is a partially enlarged view of region "A" of FIG. 2A.

Referring to FIGS. 1, 2A, 2B, and 3, a semiconductor device 1 according to an embodiment includes a lower structure LS, an intermediate structure MS on the lower structure LS, and an upper structure US on the intermediate structure MS.

The lower structure LS may include a substrate 3, a circuit element 9 on the substrate 3, a peripheral connection structure 24 electrically connected to the circuit element 9 and on the substrate 3, bit lines 33 on the peripheral connection structure 24, and a peripheral insulating structure 18 on the substrate 3. The substrate 3 may be a semiconductor substrate.

The lower structure LS may further include a device isolation layer 6s formed in the substrate 3 and defining a peripheral active region 6a.

The circuit element 9 may include a peripheral gate 9g on the peripheral active region 6a and peripheral sources/drains 9sd formed in the peripheral active region 6a on both sides of the peripheral gate 9g. The peripheral gate 9g may include a peripheral gate dielectric 9g1 and a peripheral gate electrode 9g2 on the peripheral gate dielectric 9g1.

The lower structure LS may further include a peripheral gate capping layer 12 on the peripheral gate 9g, and a peripheral gate spacer 15 on side surfaces of the peripheral gate 9g and the peripheral gate capping layer 12. The peripheral gate spacer 15 may cover the side surfaces of the peripheral gate 9g and the peripheral gate capping layer 12. The peripheral gate capping layer 12 may be formed of an insulating material. The peripheral gate spacers 15 may be formed of an insulating material.

The peripheral insulating structure 18 may be on, and for example, may cover the circuit element 9. The peripheral connection structure 24 and the bit lines 33 may be embedded in the peripheral insulating structure 18. The peripheral insulating structure 18 may include a first peripheral insulating layer 18a, a second peripheral insulating layer 18b on the first peripheral insulating layer 18a, a third peripheral insulating layer 18c on the second peripheral insulating layer 18b, and a fourth peripheral insulating layer 18d on the third peripheral insulating layer 18c. The first peripheral insulating layer 18a may be disposed on the side surfaces of the peripheral gate 9g and the peripheral gate capping layer 12 on the substrate 3. The peripheral gate spacer 15 may be disposed between the first peripheral insulating layer 18a and side surfaces of the peripheral gate 9g and the peripheral gate capping layer 12. The second peripheral insulating layer 18b may be on, and for example, may cover the first peripheral insulating layer 18a and the peripheral gate capping layer 12.

The peripheral connection structure 24 may include first connection patterns 24a, second connection patterns 24b on the first connection patterns 24a, and third connection patterns 24c on the second connection patterns 24b. The first to third connection patterns 24a, 24b, and 24c may be formed of a conductive material.

The first connection patterns 24a may be electrically connected to the circuit element 9. The first connection patterns 24a may pass through the first peripheral insulating layer 18a to extend into the second peripheral insulating layer 18b, and the second connection patterns 24b may include an upper surface coplanar with an upper surface of the second peripheral insulating layer 18b and may be embedded in the second peripheral insulating layer 18b. The third peripheral insulating layer 18c may be an etch stop layer on the second peripheral insulating layer 18b and the second connection pattern 24b. The third peripheral insulating layer 18c may cover the second peripheral insulating layer 18b and the second connection pattern 24b. The third connection patterns 24c may pass through the third peripheral insulating layer 18c to be electrically connected to the second connection patterns 24b and may extend into the fourth peripheral insulating layer 18d.

The bit lines 33 may have upper surfaces coplanar with an upper surface of the fourth peripheral insulating layer 18d, and may be embedded in the fourth peripheral insulating layer 18d. The bit lines 33 may be electrically connected to the third connection patterns 24c. The bit lines 33 may be formed of a conductive material, such as Ru, Mo, W, or Cu, but embodiments are not limited thereto. The bit lines 33 may have a line shape extending in a first direction X, parallel to an upper surface of the substrate 3.

The lower structure LS may further include insulating patterns 30 that are self-aligned with the bit lines 33 under the bit lines 33. The third connection patterns 24c may pass through the insulating patterns 30 to contact the bit lines 33.

The lower structure LS may further include shielding patterns 27 between the bit lines 33. Each of the shielding patterns 27 may be disposed between a pair of bit lines 33 adjacent to each other. The shielding patterns 27 may have a line shape extending in the first direction X. The shielding patterns 27 may be formed of a conductive material. For example, the shielding patterns 27 may be formed of a conductive material such as Ru, Mo, W, or Cu, but embodiments are not limited thereto.

The shielding patterns 27 may shield capacitive coupling between the bit lines 33 adjacent to each other. For example, the shielding patterns 27 may reduce or block parasitic capacitance between the bit lines 33, thereby minimizing RC delay (Resistive-Capacitive delay) in the bit lines 33.

The intermediate structure MS may include a plurality of vertical channel structures 58 and a plurality of gate structures 64. The intermediate structure MS may further include first insulating patterns 53 and second insulating patterns 71. The intermediate structure MS may further include an insulating layer 50 below the first insulating patterns 53. The intermediate structure MS may further include third insulating patterns 78. The intermediate structure MS may further include contact patterns 75.

The insulating layer 50 may be formed of a material having etch selectivity different from that of a material of the first insulating patterns 53 and a material of the fourth peripheral insulating layer 18*d*. Each of the plurality of vertical channel structures 58 may be disposed between the first insulating patterns 53 adjacent to each other and may pass through the insulating layer 50 to contact the bit lines 33. The plurality of vertical channel structures 58 may be spaced apart from each other.

Each of the plurality of vertical channel structures 58 may include a lower portion 58_B and a first vertical portion 58_S1 extending upwardly from a first side of the lower portion 58_B. Each of the plurality of vertical channel structures 58 may further include a second vertical portion 58_S2 extending upwardly from a second side of the lower portion 58_B. In each of the plurality of vertical channel structures 58, the first side and the second side of the lower portion 58_B may face each other in the first direction X.

The plurality of vertical channel structures 58 may include a first channel structure 58*a* and a second channel structure 58*b* spaced apart from each other on one bit line.

Each of the plurality of gate structures 64 may include a gate dielectric layer 59 and a gate electrode 62. The gate electrode 62 may be a word line. The plurality of gate structures 64 may include first and second gate structures 64*a* and 64*b* adjacent to each other on each of the plurality of vertical channel structures 58. For example, on the first channel structure 58*a*, the first and second gate structures 64*a* and 64*b* may be disposed on the lower portion 58_B of the first channel structure 58*a* and may be disposed between the first and second vertical portions 58_S1 and 58_S2. The first gate structure 64*a* may be in contact with the first vertical portion 58_S1 of the first channel structure, and the second gate structure 64*b* may be in contact with the second vertical portion 58_S2 of the first channel structure. An upper end of the gate dielectric layer 59 may be positioned on a level higher than that of an upper end of the gate electrode 62.

The first gate structure 64*a* may include a first gate electrode 62*a* extending in a second direction Y, intersecting the first direction X, and a first gate dielectric layer 59*a* between the first gate electrode 62*a* and the first channel structure 58*a*, and the second gate structure 64*b* may include a second gate electrode 62*b* extending in the second direction Y and a second gate dielectric layer 59*b* between the second gate electrode 62*b* and the first channel structure 58*a*. The first gate dielectric layer 59*a* may be in contact with the first channel structure 58*a*. The second gate dielectric layer 59*b* may contact the first channel structure 58*a*. The first gate dielectric layer 59*a* may be in contact with the first vertical portion 58_S1 of the first channel structure 58*a* and may be in contact with a portion of the lower portion 58_B of the first channel structure 58*a*. The second gate dielectric layer 59*b* may be in contact with the second vertical portion 58_S2 of the first channel structure 58*a* and may be in contact with a portion of the lower portion 58_B of the first channel structure 58*a*.

The second insulating patterns 71 may be disposed on the lower portions 58_B of the plurality of vertical channel structures 58 and may extend in the second direction Y. For example, one of the second insulating patterns 71 may be disposed on the lower portion 58_B of the first channel structure 58*a* and extend in the second direction Y and may be on, and for example, may cover side surfaces of the lower portion 58_B in the second direction Y.

The second insulating patterns 71 may separate the gate structures 64 in the first direction X on the lower portions 58_B of the plurality of vertical channel structures 58. For example, on the first channel structure 58*a*, one second insulating pattern 71 may separate the first gate structure 64*a* and the second gate structure 64*b* in the first direction X. The second insulating patterns 71 may contact the lower portions 58_B of the plurality of vertical channel structures 58.

Each of the second insulating patterns 71 may include a first material layer 67 and a second material layer 70 different from each other. The second material layer 70 may include a lower portion 70*a* on and, for example, may cover a lower surface and side surfaces of the first material layer 67, as well as an upper portion 70*b* on and for example, may cover, an upper surface of the first material layer 67 on the lower portion 70*a*. The first material layer 67 may be a silicon oxide or silicon oxide-based insulating material, and the second material layer 70 may be a silicon nitride or a silicon nitride-based insulating material.

The contact patterns 75 may be disposed on the plurality of vertical channel structures 58. The contact patterns 75 may be electrically connected to the first and second vertical portions 58_S1 and 58_S2 of the plurality of vertical channel structures 58, respectively. Each of the contact patterns 75 may include a first contact portion 73*a* and a second contact portion 73*b* having a width greater than that of the first contact portion 73*a* on the first contact portion 73*a*. The contact patterns 75 may include a first contact pattern 75*a* electrically connected to the first vertical portion 58_S1 and a second contact pattern 75*b* electrically connected to the second vertical portion 58_S2. The first contact pattern 75*a* may contact an upper surface of the first vertical portion 58_S1, and the second contact pattern 75*b* may contact an upper surface of the second vertical portion 58_S2.

The third insulating patterns 78 may be disposed between the second contact portions 73*b* of the contact patterns 75 to separate the second contact portions 73*b* from each other and may extend downwardly. For example, the third insulating patterns 78 may be disposed between the second contact portions 73*b* of the contact patterns 75, and may extend into the first insulating patterns 53 and the second insulating patterns 71. The third insulating patterns 78 may extend into the upper portion 70*b* of the second material layer 70 of the second insulating patterns 71, and may be spaced apart from the first material layer 67.

The upper structure US may include a data storage structure 90. The data storage structure 90 may be a capacitor structure capable of storing information in a memory such as DRAM. For example, the data storage structure 90 may include first electrodes 84 electrically connected to the contact patterns 75, a dielectric layer 86 on surfaces of the first electrodes 84, and a second electrode 88 on the dielectric layer 86. For example, the dielectric layer 86 may cover the surfaces of the first electrodes 84.

The data storage structure 90 may be a capacitor structure capable of storing data in a memory such as DRAM, but embodiments are not limited thereto, and the data storage structure 90 may be a structure capable of storing data in a memory other than DRAM.

The upper structure US may further include an etch stop layer 81 and a supporter 93. The first electrodes 84 may pass through the etch stop layer 81 to contact the contact patterns 75. In order to prevent the first electrodes 84 from being collapsed or bent, the supporter 93 may contact the first electrodes 84 and may have an opening. In the data storage structure 90, the dielectric layer 86 may be on and, for example, may cover an upper surface of the etch stop layer 81 in contact with the first electrodes 84 and a surface of the supporter 93.

In an embodiment, each of the plurality of vertical channel structures 58 may include a plurality of layers 55, 56, and 57. In each of the plurality of vertical channel structures 58, the plurality of layers 55, 56, and 57 may include a first layer 55, a second layer 56 and a third layer 57. The first layer 55, the second layer 56, and the third layer 57 may be sequentially stacked. In the 'U'-shaped vertical channel structure 58, the first layer 55, the second layer 56, and the third layer 57 may each have a 'U' shape. For example, the first layer 55 may have a 'U' shape, the second layer 56 may be on and, for example, may conformally cover an inner wall of the first layer 55 of the second layer 56, and the third layer 57 may be on and, for example, may conformally cover an inner wall of the second layer 56.

The first layers 55 of the plurality of vertical channel structures 58 may contact the bit lines 33. The third layers 57 of the plurality of vertical channel structures 58 may contact the gate dielectric layers 59 of the gate structures 64.

At least one of the plurality of layers 55, 56, and 57 may be an oxide semiconductor layer or a two-dimensional (2D) material layer.

The oxide semiconductor layer may be indium gallium zinc oxide (IGZO). However, embodiments are not limited thereto. For example, the oxide semiconductor layer may include at least one of indium tungsten oxide (IWO), indium tin gallium oxide (ITGO), indium aluminum zinc oxide (IAGO), indium gallium oxide (IGO), indium tin zinc oxide (ITZO), zinc tin oxide (ZTO), indium zinc oxide (IZO), ZnO, indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), or indium gallium silicon oxide (InGaSiO).

The 2D material layer may be a material having an energy band gap of about 1.2 eV or greater. The 2D material layer may include at least one of a transition metal dichalcogenide material layer (TMD), a black phosphorous material layer, or a hexagonal boron-nitride material layer (hBN). For example, the 2D material layer may include at least one of BiOSe, CrI, $WSe_2$, $MoS_2$, SnSe, ReS, β-SnTe, MnO, AsS, P(black), InSe, h-BN, GaSe, GaN capable of forming a 2D material, SrTiO, MXenes, and Janus 2D materials (X-M-Y structure, M=transition metal, X≠Y, X/Y=Y=O, S, Se, Te, DB, /Vacancy, OH, B, P, C, N, F, Cl).

The first to third layers 55, 56, and 57 may have the same thickness, but embodiments are not limited thereto.

The first layer 55 may have a thickness of about 0.1 nm to about 20 nm.

The second layer 56 may have a thickness of about 0.1 nm to about 20 nm.

The third layer 57 may have a thickness of about 0.1 nm to about 20 nm.

Each of the plurality of vertical channel structures 58 may have a thickness of about 0.1 nm to about 30 nm. When each of the plurality of vertical channel structures 58 has a thickness of about 0.1 nm, each of the first layer 55, the second layer 56, and the third layer 57 may have a thickness smaller than about 0.1 nm.

In an embodiment, each of the plurality of vertical channel structures 58 may include different oxide semiconductor layers. For example, in each of the plurality of vertical channel structures 58, the first layer 55 may be a first oxide semiconductor layer, the second layer 56 may be a second oxide semiconductor layer, and the third layer 57 may be a third oxide semiconductor layer.

The second oxide semiconductor layer of the second layer 56 may be different from the first oxide semiconductor layer 55 and/or the third oxide semiconductor layer 57. For example, the second oxide semiconductor layer of the second layer 56 may be an oxide semiconductor having a higher content of at least one of In, Sn, Bi, W, and H than at least one of the first and third oxide semiconductor layers of the first and third layers 55 and 57.

The first oxide semiconductor layer may be an oxide semiconductor layer doped with an element X, the third oxide semiconductor layer may be an oxide semiconductor layer doped with an element Y. The element X may include at least one of Si, Nb, Ta, Y, N, F, or Mg, and the element Y may include at least one of Si, Nb, Ta, Y, N, F, or Mg. For example, at least one of the first and third oxide semiconductor layers may include at least one of N-doped IGZO, F-doped IGZO, Nb-doped IGZO, Si-doped IGZO, Ta-doped IGZO, Y-doped IGZO, or Mg-doped IGZO.

The first and third oxide semiconductor layers may be the same as each other. For example, the element X and the element Y may be the same as each other.

The first and third oxide semiconductor layers may be different from each other. For example, the element X and the element Y may be different from each other.

At least one of the first to third layers 55, 56, and 57 may be an amorphous oxide semiconductor, and the other layers may be a crystalline oxide semiconductor and/or a spinel-phase oxide semiconductor.

In another embodiment, each of the plurality of vertical channel structures 58 may include an oxide semiconductor layer and a metal oxide layer. For example, in each of the plurality of vertical channel structures 58, at least one of the first to third layers 55, 56, and 57 may be an amorphous oxide semiconductor, another may be a crystalline oxide semiconductor or a spinel-phase oxide semiconductor, and the other one may be a metal oxide such as AlO or TiO. For example, the first layer 55 may be an amorphous oxide semiconductor, the second layer 56 may be a crystalline oxide semiconductor or a spinel-phase oxide semiconductor, and the third layer 57 may be a metal oxide. In another example, the second layer 56 may be an amorphous oxide semiconductor, the first layer 55 may be a crystalline oxide semiconductor or a spinel-phase oxide semiconductor, and the third layer 57 may be a metal oxide. In another example, the third layer 57 may be an amorphous oxide semiconductor, the second layer 56 may be a crystalline oxide semiconductor or a spinel-phase oxide semiconductor, and the first layer 55 may be a metal oxide. In another example, the second layer 56 may be an amorphous oxide semiconductor, the third layer 57 may be a crystalline oxide semiconductor or a spinel-phase oxide semiconductor, and the first layer 55 may be a metal oxide.

In another embodiment, each of the plurality of vertical channel structures 58 may include any one of the oxide semiconductor layers described above and a 2D material layer having an energy band gap of about 1.2 eV or greater. For example, one or two of the first to third layers 55, 56, and 57 may be an oxide semiconductor, and the other layers may be a 2D material.

In another embodiment, each of the plurality of vertical channel structures 58 may include the 2D material layer and the metal oxide layer. For example, one or two of the first to third layers 55, 56, and 57 may be a 2D material, and the other layers may be a metal oxide.

A thickness and material type of the first to third layers 55, 56, and 57 may vary according to characteristics of the semiconductor device 1. For example, the second layer 56 may be an oxide semiconductor layer or a 2D material layer having a mobility higher than those of the first and third layers 55 and 57, and the first and third layers 55 and 57 may be a material layer having thermal stress and/or electrical stress higher than that of the second layer 56. The first and third layers 55 and 57 may be material layers having reliability higher than that of the second layer 56.

In some embodiments, reliability may be prioritized in the semiconductor device 1. Thus, at least one of the first and third layers 55 and 57 may be formed thicker than that of the second layer 56.

In some embodiments, performance may be prioritized in the semiconductor device 1. Thus, the second layer 56 may be formed to be thicker than at least one of the first and third layers 55 and 57. Accordingly, the thickness of the first to third layers 55, 56, and 57 may be variously modified as described below according to reliability and performance required for the semiconductor device 1.

Hereinafter, various modified examples of the elements of the semiconductor device 1 described above will be described. Various modified examples of the elements of the aforementioned semiconductor device 1 to be described below will be mainly described based on the elements to be modified or elements to be replaced. In addition, although the elements that may be modified or replaced below are described with reference to each drawing, the elements that may be modified may be combined with each other to configure the semiconductor device 1 according to an embodiment. Hereinafter, FIGS. 4A, 4B, 4C, 4D, 5A, 5B, 6A, and 6B are partially enlarged views schematically illustrating modified examples of the vertical channel structure 58 in the partially enlarged view of FIG. 3 to explain various modified examples of the plurality of vertical channel structures 58 of the semiconductor device 1 described above.

Figure 4A:
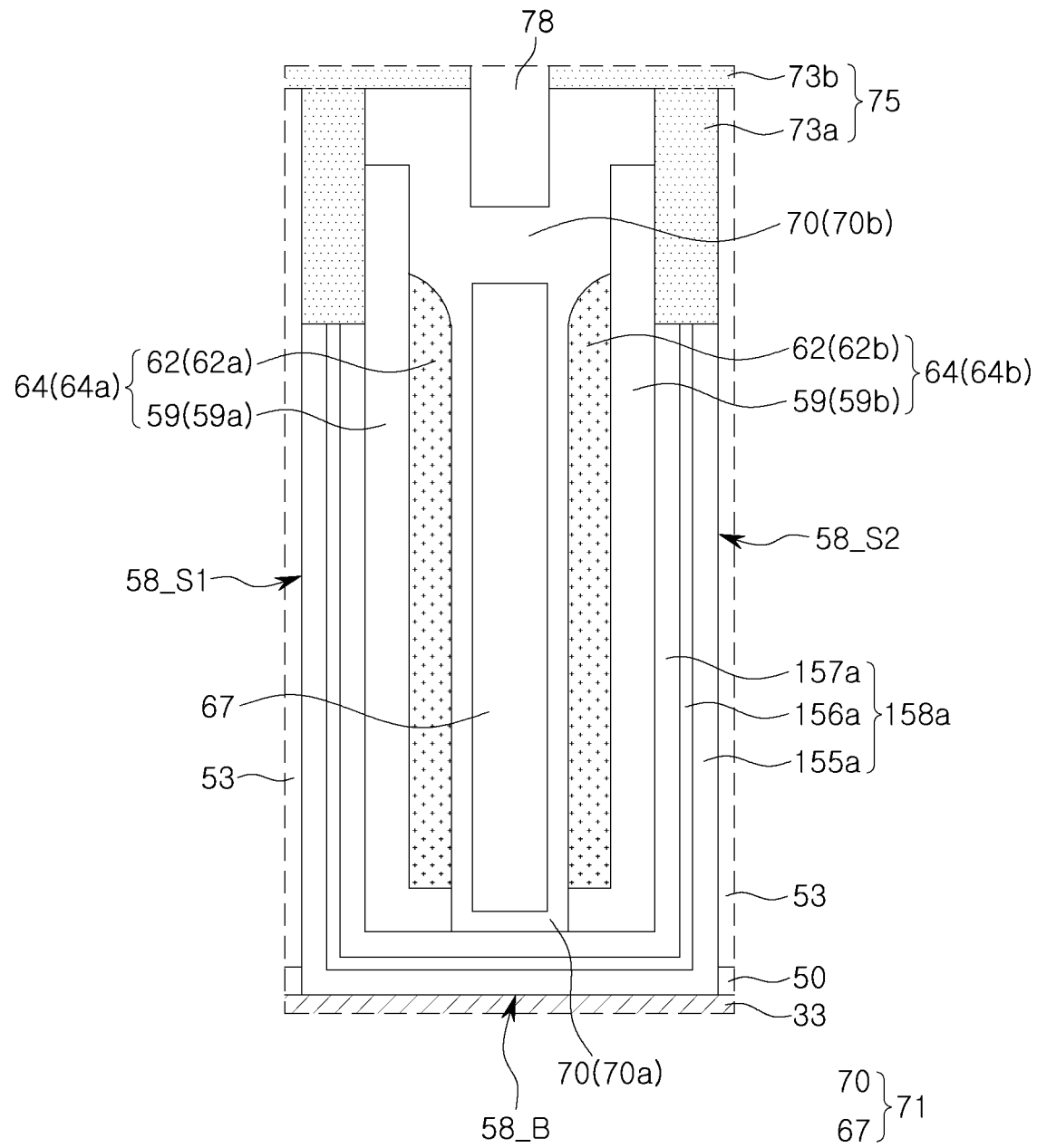
FIG. 4A is a partially enlarged view schematically illustrating a modified example of a semiconductor device according to an embodiment.

According to an embodiment, referring to FIG. 4A, each of the plurality of vertical channel structures 58 in FIG. 3 may be replaced with a vertical channel structure 158a including layers having different thicknesses. For example, the vertical channel structure 158a may include a first layer 155a, a second layer 156a, and a third layer 157a that are sequentially stacked, and the second layer 156a may have a thickness less than that of each of the first and third layers 155a and 157a. The first layer 155a may be the same material as the first layer 55 of FIG. 3, the second layer 156a may be the same material as the second layer 56 of FIG. 3, and the third layer 157a may be the same material as that of the third layer 57 of FIG. 3.

Referring to FIGS. 4B to 4D, 5A, and 5B below, the "first layer" may be the same material as the first layer 55 of FIG. 3, and the "second layer" may be the same material as the second layer of FIG. 3, and the "third layer" may be the same material as the third layer 57 of FIG. 3.

Figure 4B:
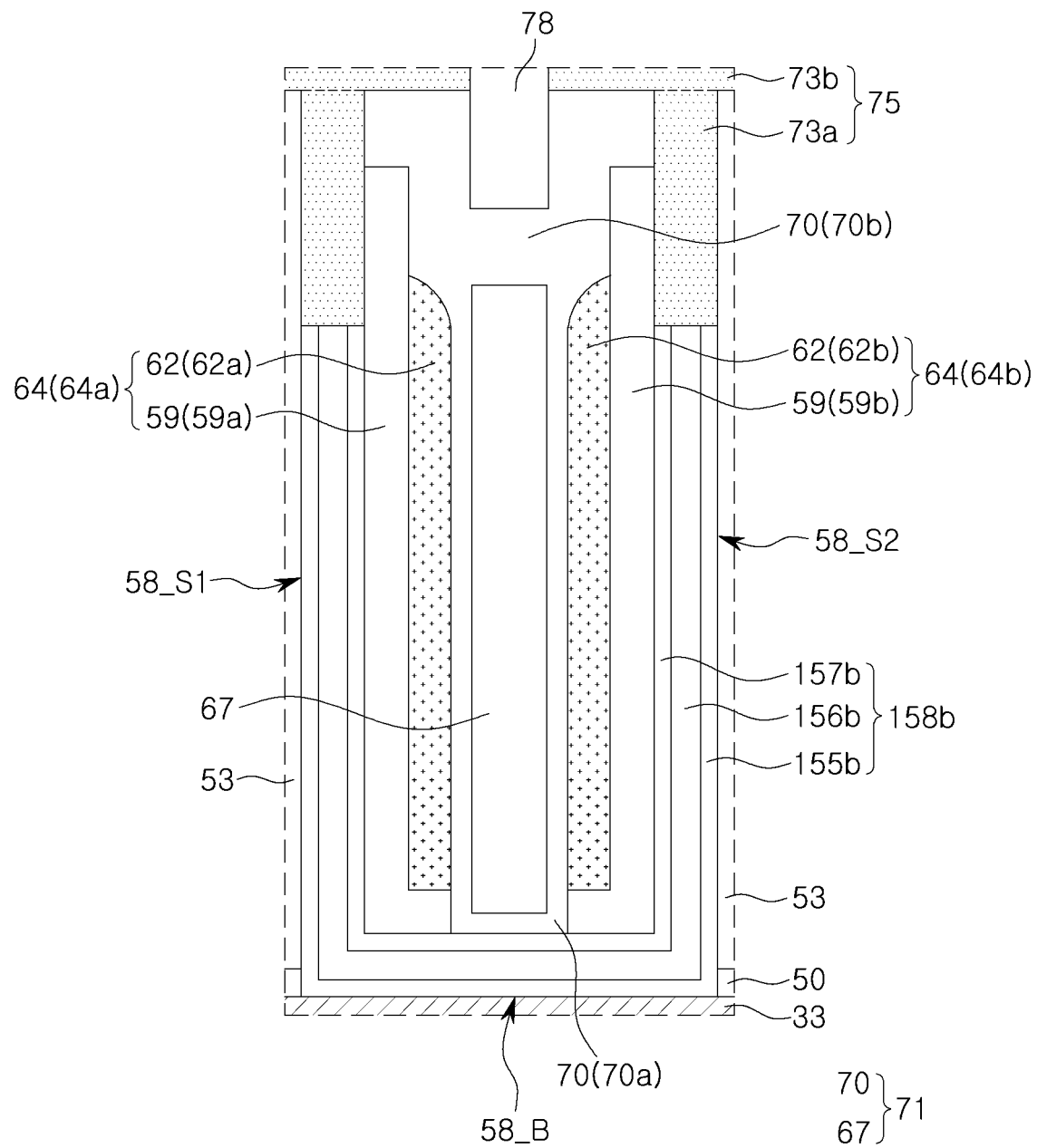
FIG. 4B is a partially enlarged view schematically illustrating a modified example of a semiconductor device according to an embodiment.

According to an embodiment, referring to FIG. 4B, each of the plurality of vertical channel structures 58 in FIG. 3 may be replaced with a vertical channel structure 158b including layers having different thicknesses. For example, the vertical channel structure 158b may include a first layer 155b, a second layer 156b, and a third layer 157b that are sequentially stacked, and the second layer 156b may have a thickness greater than the thickness of each of the first and third layers 155b and 157b.

Figure 4C:
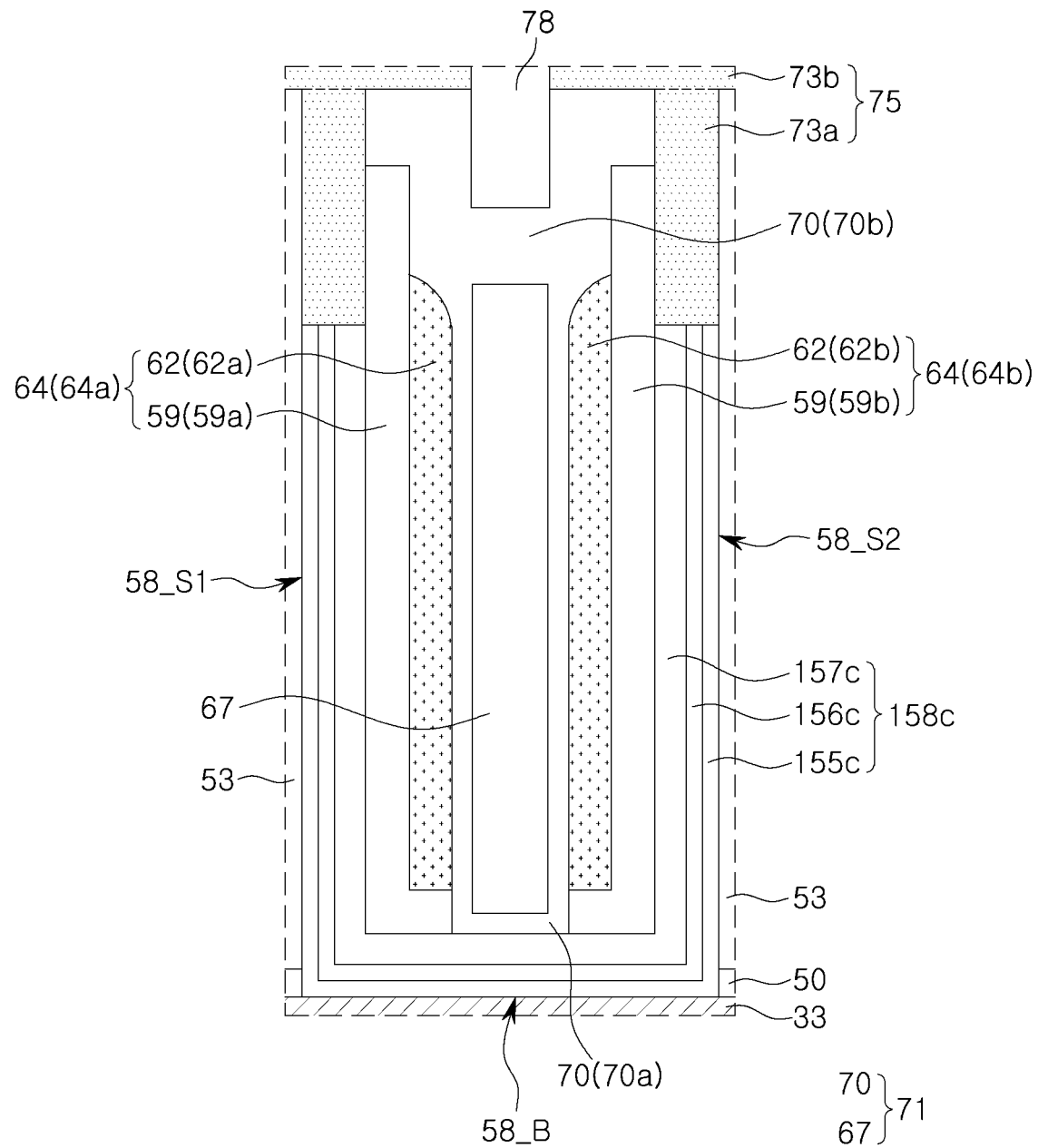
FIG. 4C is a partially enlarged view schematically illustrating a modified example of a semiconductor device according to an embodiment.

According to an embodiment, referring to FIG. 4C, each of the plurality of vertical channel structures 58 in FIG. 3 may be replaced with a vertical channel structure 158c including layers having different thicknesses. For example, the vertical channel structure 158c may include a first layer 155c, a second layer 156c, and a third layer 157c that are sequentially stacked, and the third layer 157c may have a thickness greater than the thickness of each of the first and second layers 155c and 156c.

Figure 4D:
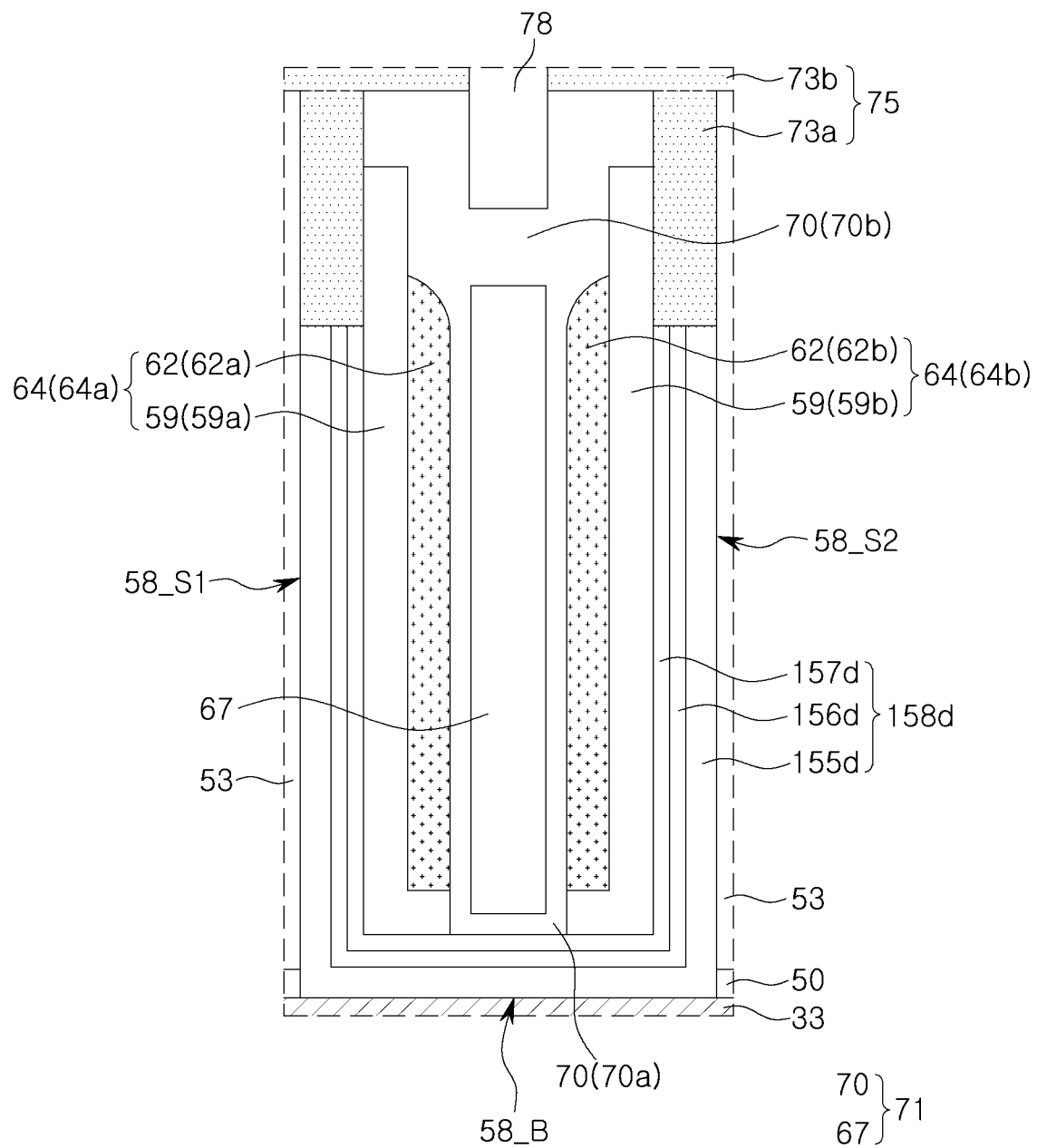
FIG. 4D is a partially enlarged view schematically illustrating a modified example of a semiconductor device according to an embodiment.

According to an embodiment, referring to FIG. 4D, each of the plurality of vertical channel structures 58 in FIG. 3 may be replaced with a vertical channel structure 158d including layers having different thicknesses. For example, the vertical channel structure 158d may include a first layer 155d, a second layer 156d, and a third layer 157d that are sequentially stacked, and the first layer 155d may have a thickness greater than the thickness of each of the second and third layers 156d and 157d.

Figure 5A:
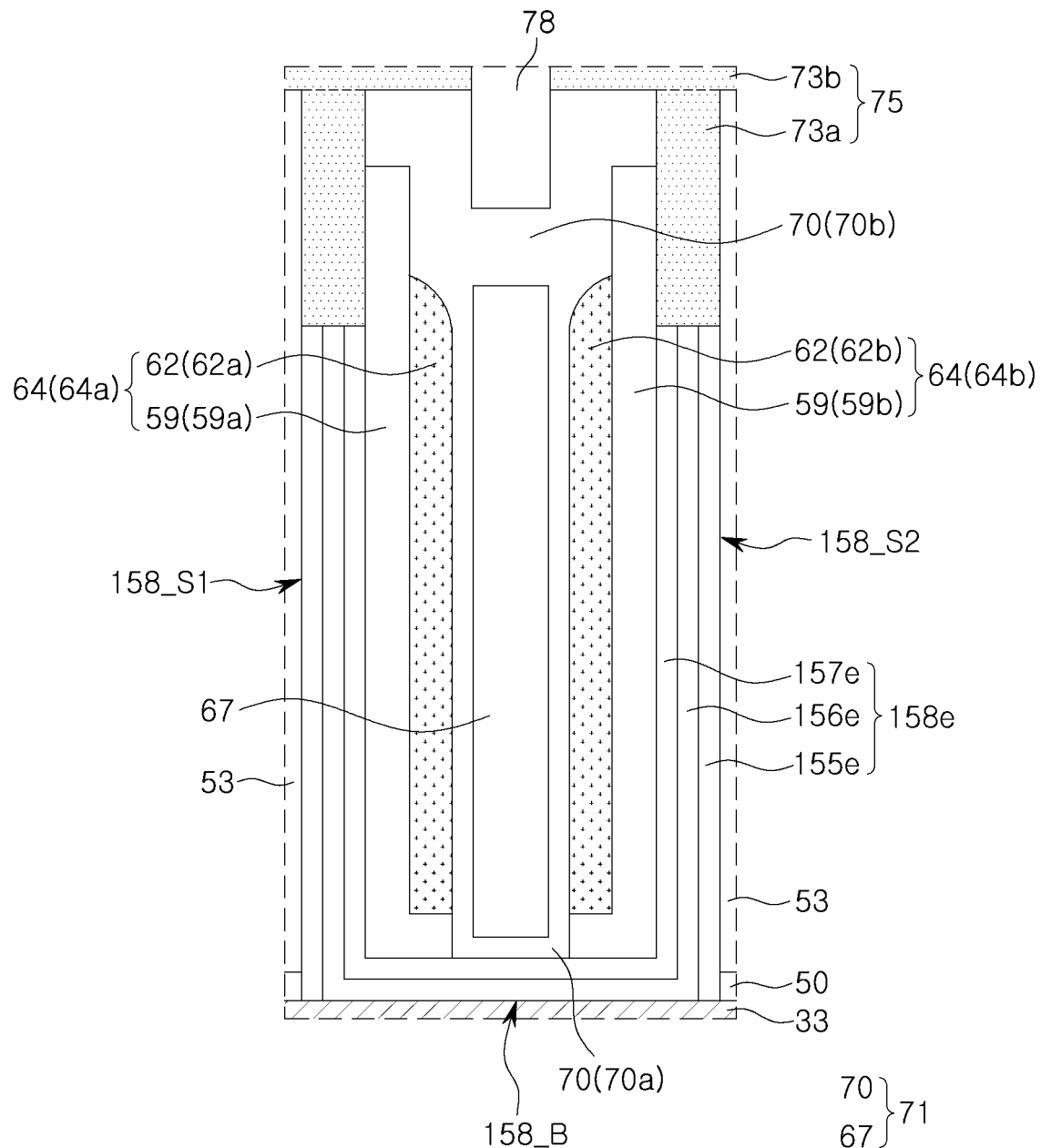
FIG. 5A is a partially enlarged view schematically illustrating a modified example of a semiconductor device according to an embodiment.

According to an embodiment, referring to FIG. 5A, each of the plurality of vertical channel structures 58 in FIG. 3 may be replaced with a vertical channel structure 158e as in FIG. 5A. The vertical channel structure 158e may include a first layer 155e, a second layer 156e, and a third layer 157e. The second layer 156e may have a U shape, the third layer 157e may have a U shape conformally provided on an inner wall of the second layer 156e, and the first layer 155e may be on an outer wall of the second layer 156e. The third layer 157e may conformally cover the inner wall of the second layer 156e. The first layer 155e may cover the outer wall of the second layer 156e, and a lower surface of the first layer 155e may be in contact with the bit line 33. In the vertical channel structure 158e, a lower surface of the second layer 156e may be in contact with the bit line 33, and the third layer 157e may be in contact with the gate dielectric layer 59. The lower surface of the first layer 155e and the lower surface of the second layer 156e may be coplanar.

In the vertical channel structure 158e, the thickness of the lower portion 158_B in contact with the bit line 33 may be less than a thickness of each of the first and second vertical portions 158_S1 and 158_S2 extending upwardly from opposite sides of the lower portion 158_B.

Figure 5B:
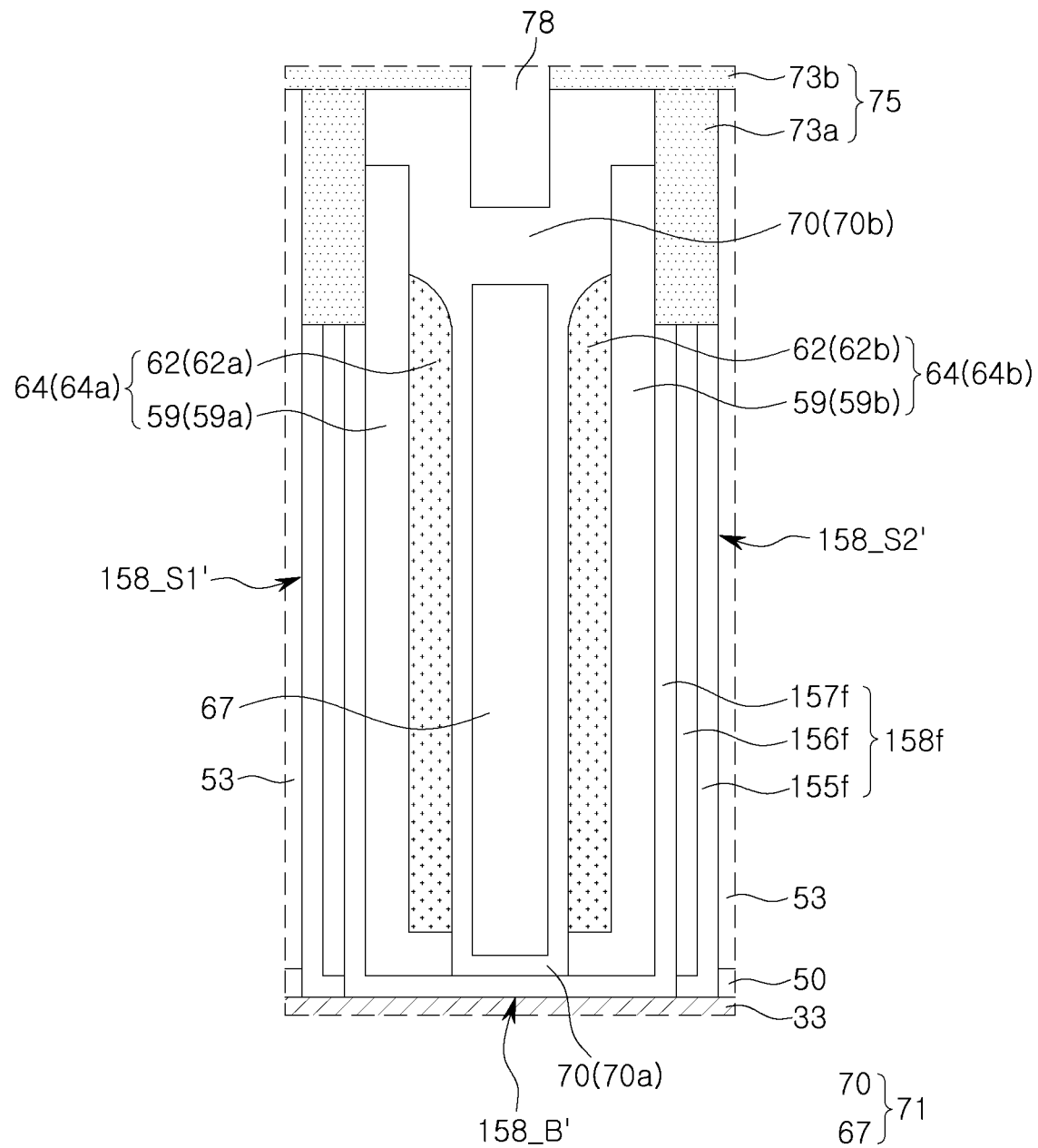
FIG. 5B is a partially enlarged view schematically illustrating a modified example of a semiconductor device according to an embodiment.

According to an embodiment, referring to FIG. 5B, each of the plurality of vertical channel structures 58 in FIG. 3 may be replaced with a vertical channel structure 158f as illustrated in FIG. 5B. The vertical channel structure 158f may include a first layer 155f, a second layer 156f, and a third layer 157f. The third layer 157f may have a U shape, the second layer 156f may have an I-shape on an outer wall of the third layer 157*f*, and the first layer 155*f* may be on and, for example, may cover an outer wall and a lower end of the second layer 156*f*. The first layer 155*f* may extend between the bit line 33 and the second layer 156*f*, and may be in contact with a lower portion of the third layer 157*f*. In the vertical channel structure 158*f*, lower surfaces of the third layer 157*f* and the first layer 155*f* may contact the bit line 33, and the third layer 157*f* may contact the gate dielectric layer 59.

In the vertical channel structure 158*f*, a thickness of a lower portion 158_B' in contact with the bit line 33 may be less than a thickness of each of first and second vertical portions 158_S1' and 158_S2' extending upwardly from opposite sides of the lower portion 158_B'.

Figure 6A:
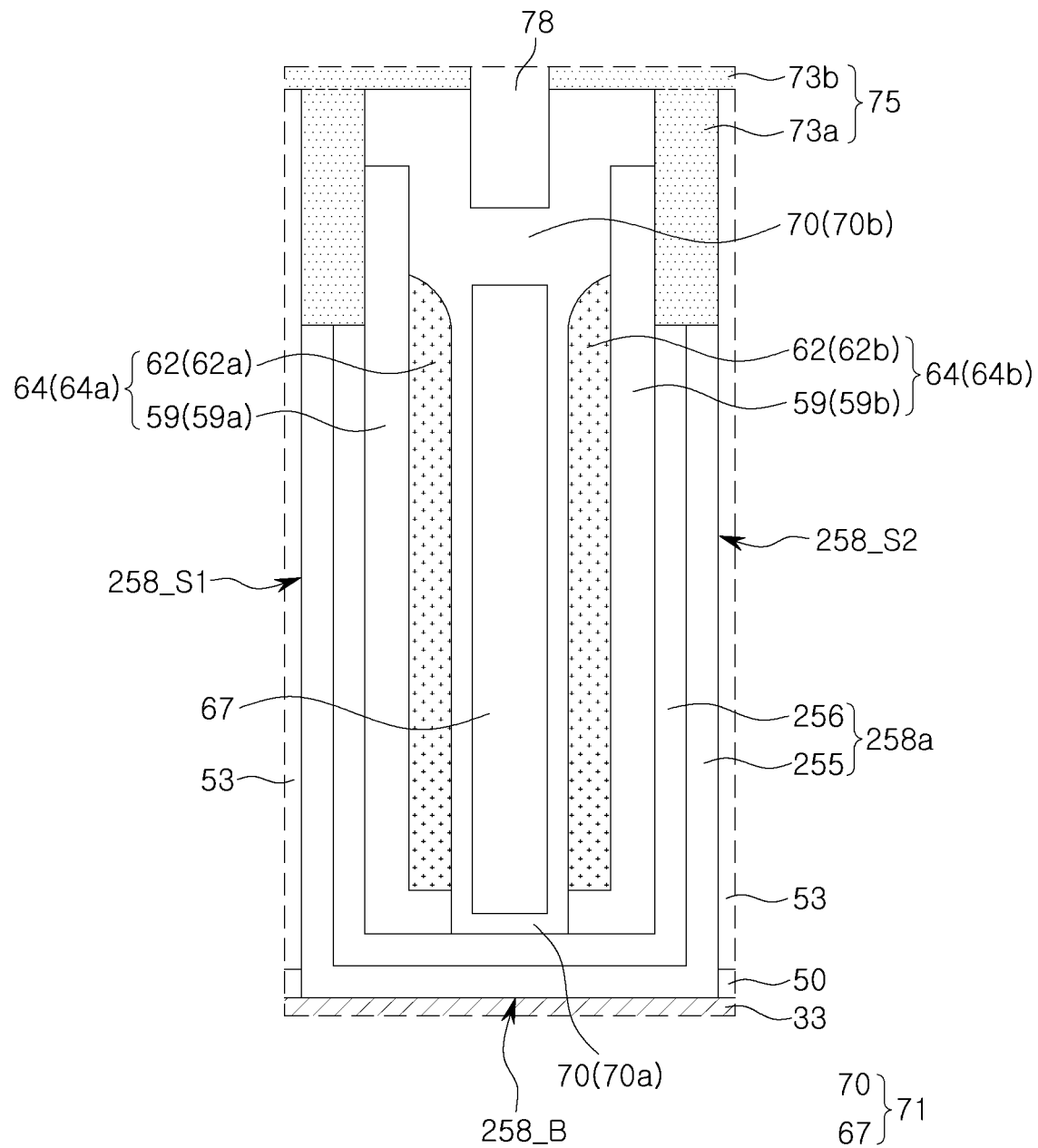
FIG. 6A is a partially enlarged view schematically illustrating a modified example of a semiconductor device according to an embodiment.

According to an embodiment, referring to FIG. 6A, each of the plurality of vertical channel structures 58 in FIG. 3. may be replaced with a vertical channel structure 258*a* as illustrated in FIG. 6A. The vertical channel structure 258*a* may include two layers, for example, a lower layer 255 and an upper layer 256 on the lower layer 255. The lower layer 255 may have a U shape, and the upper layer 256 may be on and, for example, may conformally cover an inner wall of the lower layer 255 and may have a U shape.

A lower surface of the lower layer 255 may contact the bit line 33. The upper layer 256 may contact the gate dielectric layer 59.

The lower layer 255 may be the same material as any one of the materials of the first to third layers (55, 56, and 57 in FIG. 3) described with reference to FIG. 3, and the upper layer 256 may be a material different from that of the lower layer 255, among materials of the first to third layers (55, 56, and 57 in FIG. 3).

The lower layer 255 may be an oxide semiconductor layer or a 2D material layer having mobility higher than the upper layer 256, and the upper layer 256 may be a material layer with thermal stress and/or electrical stress stronger than the lower layer 255. For example, the lower layer 255 may be an oxide semiconductor layer doped with an element X. The element X may be at least one of Si, Nb, Ta, Y, N, F, or Mg. The upper layer 256 may be an oxide semiconductor having a higher content of at least one of In, Sn, Bi, W, or H than the oxide semiconductor of the lower layer 255.

In another example, the lower layer 255 may be an oxide semiconductor layer doped with the element X, and the upper layer 256 may be a metal oxide layer. The metal oxide layer of the upper layer 256 may include at least one of AlOx or TiOx.

In the vertical channel structure 258*a*, a thickness of a lower portion 258_B in contact with the bit line 33 may be substantially equal to a thickness of each of first and second vertical portions 258_S1 and 258_S2 extending upwardly from opposite sides of the lower portion 258_B.

In an example, the lower layer 255 and the upper layer 256 may have the same thickness. In another example, the lower layer 255 may be thicker than the upper layer 256. In another example, the lower layer 255 may be thinner than the upper layer 256.

The lower layer 255 may have a thickness of about 0.1 nm to about 20 nm.

The upper layer 256 may have a thickness of about 0.1 nm to about 20 nm.

The vertical channel structure 258*a* may have a thickness of about 0.1 nm to about 30 nm. When the vertical channel structure 258*a* has a thickness of about 0.1 nm, the lower layer 255 and the upper layer 256 may each have a thickness less than about 0.1 nm.

The thicknesses of the lower layer 255 and the upper layer 256 may vary according to characteristics of the semiconductor device 1. For example, in some embodiments reliability may be prioritized in the semiconductor device 1, and the lower layer 255 may be formed to be thicker than the upper layer 256. In some embodiments, performance may be prioritized in the semiconductor device 1, and the upper layer 256 may be formed to be thicker than the lower layer 255. Accordingly, the thickness of the lower layer 255 and the upper layer 256 may be changed as described above according to the reliability and performance required for the semiconductor device 1.

Figure 6B:
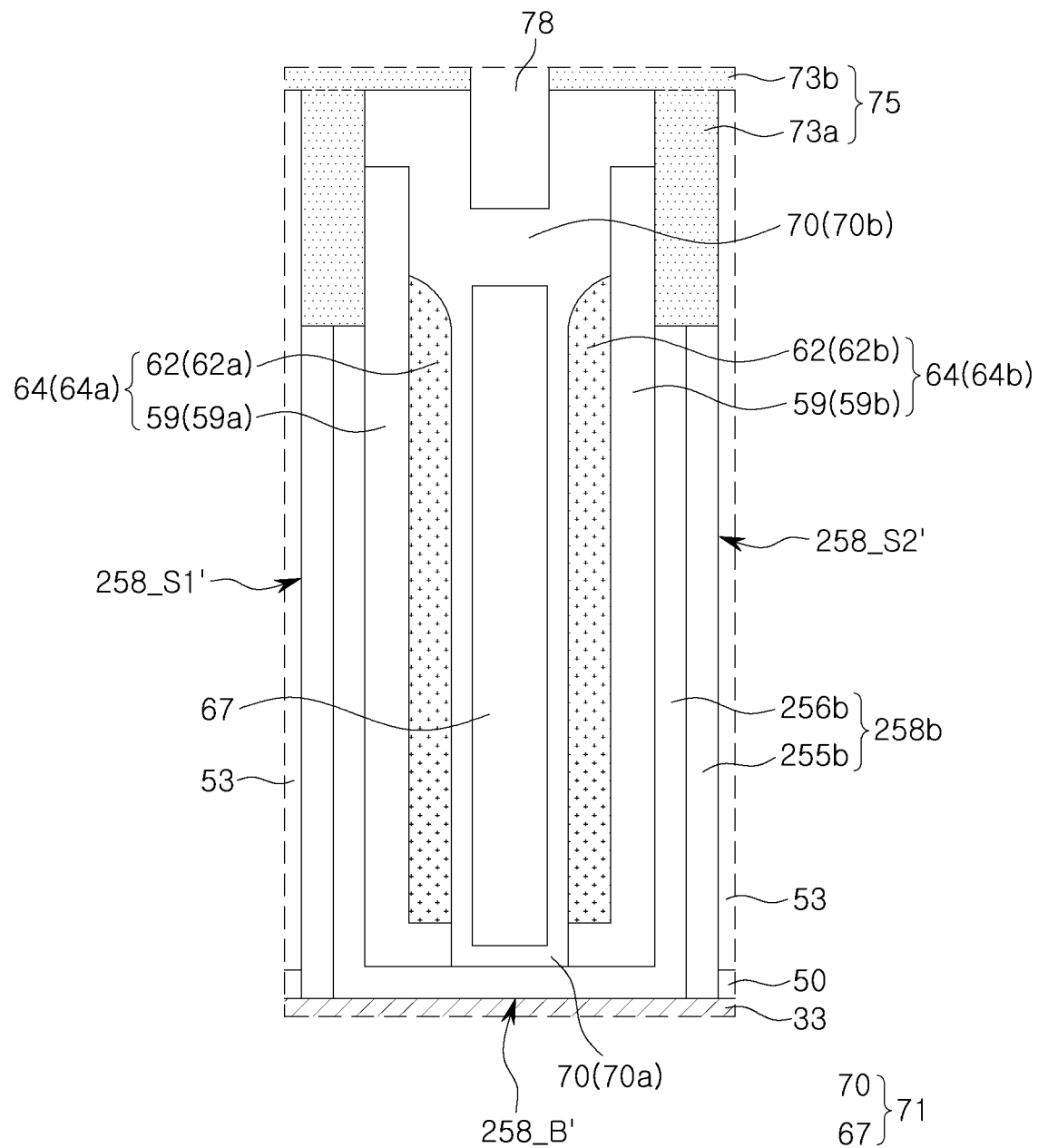
FIG. 6B is a partially enlarged view schematically illustrating a modified example of a semiconductor device according to an embodiment.

According to an embodiment, referring to FIG. 6B, the vertical channel structure 258*a* of FIG. 6A described with reference to FIG. 6A may be replaced with a vertical channel structure 258*b* as illustrated in FIG. 6B.

The vertical channel structure 258*b* may include a U-shaped upper layer 256*b* and a lower layer 255*b* on and, for example, may cover an outer surface of the upper layer 256*b*. The upper layer 256*b* may contact the bit line 33 and the gate dielectric layer 59. Lower surfaces of the lower layer 255*b* and the upper layer 256*b* may be coplanar.

The lower layer 255*b* may have the same thickness and may have the same material as those of the lower layer 255 in FIG. 6A, and the upper layer 256*b* may have the same thickness and the same material as those of the upper layer 256 in FIG. 6A. In the vertical channel structure 258*b*, a thickness of a lower portion 258_B' in contact with the bit line 33 may be less than a thickness of each of first and second vertical portions 258_S1' and 258_S2' extending upwardly from opposite sides of the lower portion 258_B'.

Figure 7A:
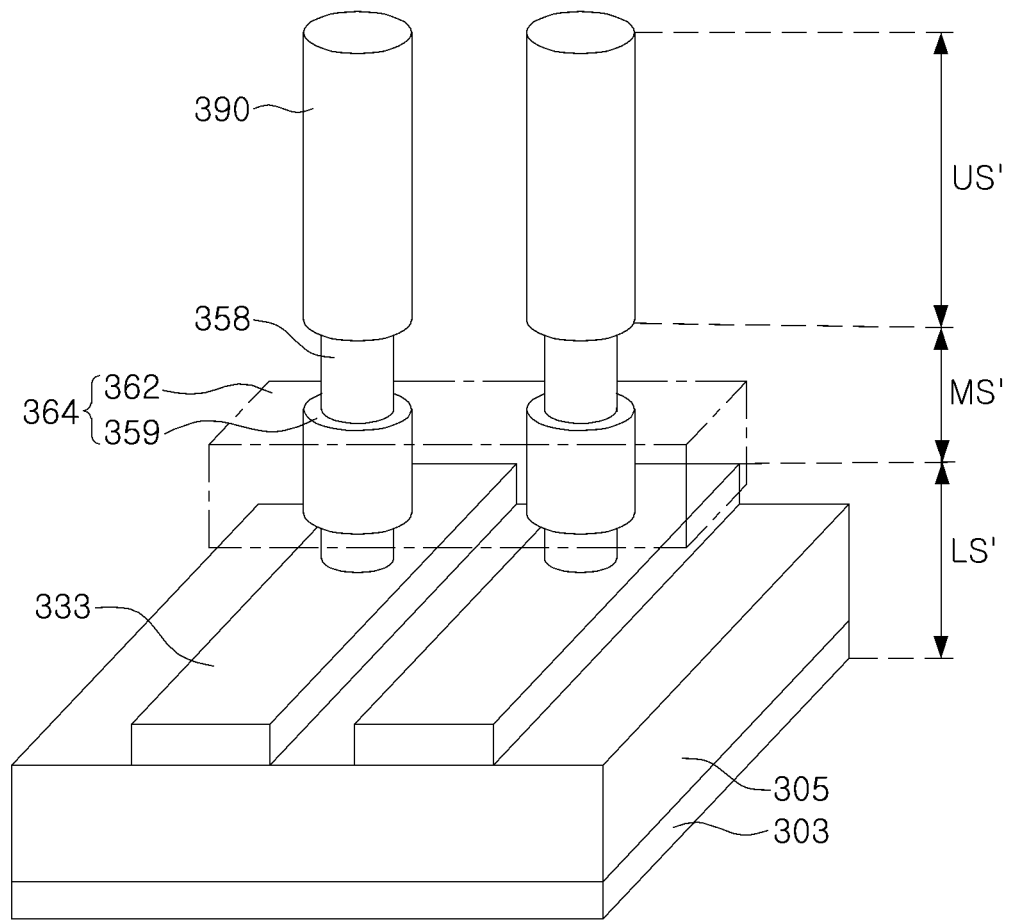
FIGS. 7A, 7B, and 7C are diagrams schematically illustrating a modified example of a semiconductor device according to an embodiment.
Figure 7B:
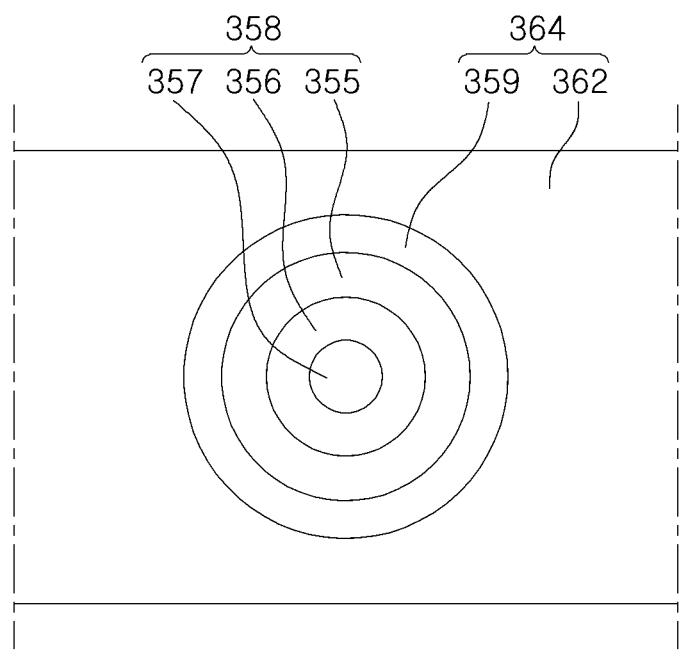
Figure 7C:
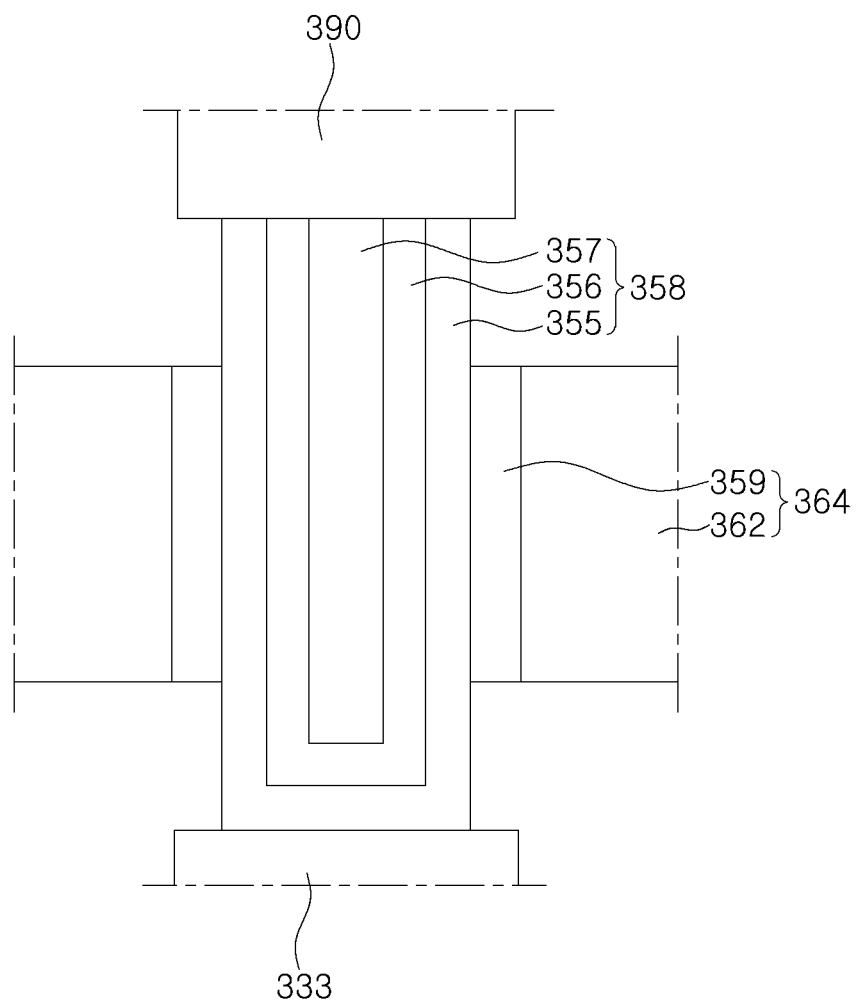

Next, a modified example of a semiconductor device according to an embodiment will be described with reference to FIGS. 7A to 7C. In FIGS. 7A to 7C, FIG. 7A is a perspective view schematically illustrating a modified example of a semiconductor device according to an embodiment, FIG. 7B is a top view schematically illustrating some elements of FIG. 7A, and FIG. 7C is a cross-sectional view schematically illustrating some elements of FIG. 7A.

According to an embodiment, referring to FIGS. 7A to 7C, the semiconductor device 300 may include a lower structure LS', an intermediate structure MS' on the lower structure LS', and an upper structure US' on the intermediate structure MS'.

The lower structure LS' may include a substrate 303, a circuit region 305 on the substrate 3, and bit lines 33 on the circuit region 305. The circuit region 305 may include the circuit element 9 and the peripheral connection structure 24 as described above with reference to FIGS. 1, 2A, and 2B.

The intermediate structure MS' may include a gate structure 364 extending in a direction intersecting the bit lines 33 on the bit lines 33, and vertical channel structures 358 passing through the gate structure 364. The vertical channel structure 358 may contact the bit lines 33. The gate structure 364 may include a gate electrode 362 and gate dielectric layers 359 between the gate electrode 362 and the vertical channel structures 358.

The upper structure US' may include a data storage structure 390 of a memory. The data storage structure 390 may be a capacitor storing data in DRAM, but embodiments are not limited thereto, and the data storage structure 390 may be a structure for storing data in a memory other than DRAM.

The gate structure 364 may be disposed to surround the entire side surface of each of the plurality of vertical channel structures 358. Each of the plurality of vertical channel structures 358 may have a columnar shape.

Each of the plurality of vertical channel structures 358 may include a first layer 355, a second layer 356, and a third layer 357. The third layer 357 may have a columnar shape. The second layer 356 may be on and, for example, may cover side and lower surfaces of the third layer 357. The first layer 355 may be on and, for example, may cover lower and outer surfaces of the second layer 356. The first layer 355 may contact the bit lines 330 and the gate structure 364. The conductive material layer of the data storage structure 390 may be connected to an upper surface of the vertical channel structure 358.

The first layer 355 may be the same material as the first layer 55 of FIG. 3, the second layer 356 may be the same material as the second layer 56 of FIG. 3, and the third layer 357 may be the same material as the third layer 57 of FIG. 3.

Next, various modified examples of the plurality of vertical channel structures (358 of FIGS. 7A to 7C) described above will be described with reference to FIGS. 8A, 8B, 8C, and 8D. FIGS. 8A, 8B, 8C, and 8D are views schematically illustrating a modified example of the vertical channel structure 358 in FIG. 7C to explain various modified examples of the plurality of vertical channel structures (358 of FIGS. 7A to 7C) described above.

Figure 8A:
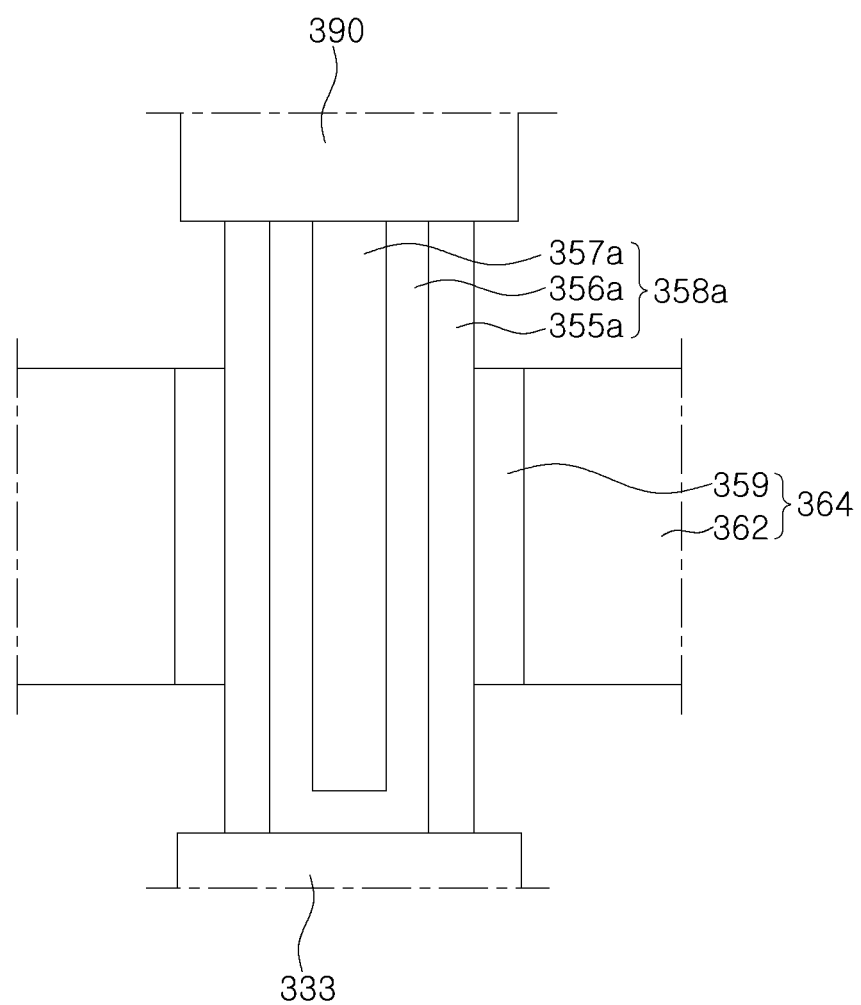
FIG. 8A is a partially enlarged view schematically illustrating a modified example of a semiconductor device according to an embodiment.

According to an embodiment, referring to FIG. 8A, each of the plurality of vertical channel structures 358 in FIG. 7C may be replaced with a vertical channel structure 358*a* as illustrated in FIG. 8A. The vertical channel structure 358*a* may include a first layer 355*a*, a second layer 356*a*, and a third layer 357*a*. The third layer 357*a* may have a columnar shape, the second layer 356*a* may be on and, for example, may cover side and lower surfaces of the third layer 357*a*, and the first layer 355*a* may be on and, for example, may cover an outer surface of second layer 356*a*. A lower surface of the second layer 356*a* and a lower surface of the first layer 355*a* may contact the bit line 333.

Figure 8B:
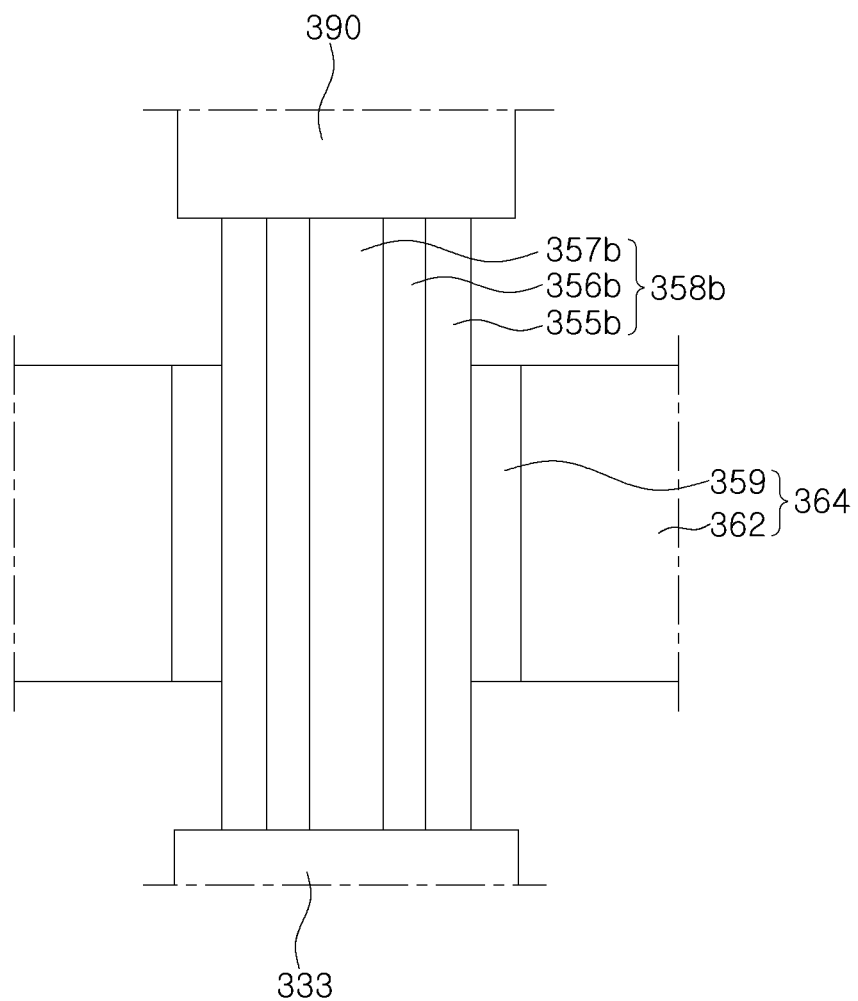
FIG. 8B is a partially enlarged view schematically illustrating a modified example of a semiconductor device according to an embodiment.

According to an embodiment, referring to FIG. 8B, each of the plurality of vertical channel structures 358 in FIG. 7C may be replaced with a vertical channel structure 358*b* as illustrated in FIG. 8B. The vertical channel structure 358*b* may include a first layer 355*b*, a second layer 356*b*, and a third layer 357*b*. The third layer 357*b* may have a columnar shape, the second layer 356*b* may be on and, for example, may cover a side surface of the third layer 357*b*, and the first layer 355*b* may be on and, for example, may cover an outer surface of the second layer 356*b*. Lower surfaces of the first to third layers 355*b*, 356*b*, and 357*b* may contact the bit line 333 and may be coplanar.

Figure 8C:
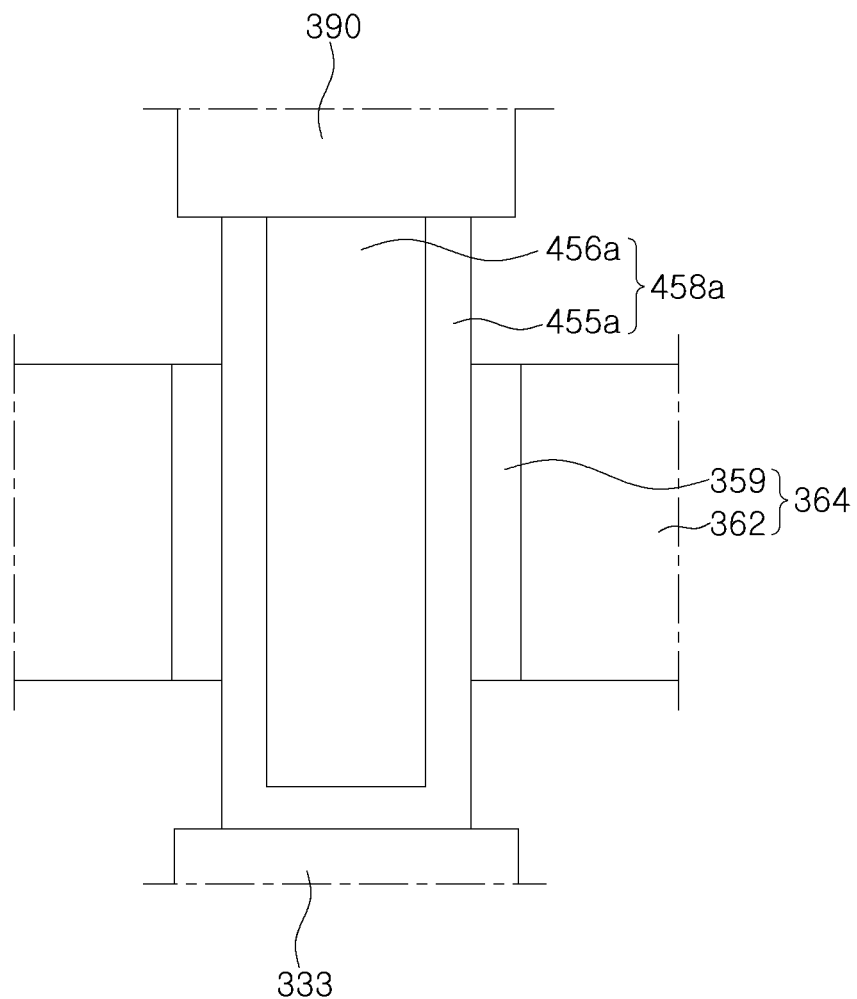
FIG. 8C is a partially enlarged view schematically illustrating a modified example of a semiconductor device according to an embodiment.

According to an embodiment, referring to FIG. 8C, each of the plurality of vertical channel structures 358 in FIG. 7C may be replaced with a vertical channel structure 458*a* including two layers 455*a* and 456*a* as in FIG. 8C. The vertical channel structure 458*a* may include a lower layer 455*a* and an upper layer 456*a*. The upper layer 456*a* may have a columnar shape, and the lower layer 455*a* may be on and, for example, may cover side and lower surfaces of the upper layer 456*a*.

The lower layer 455*a* may be formed of the same material as that of the lower layer 255 described above with reference to FIG. 6A, and the upper layer 456*a* may be formed of the same material as that of the upper layer 256 described above with reference to FIG. 6A.

Figure 8D:
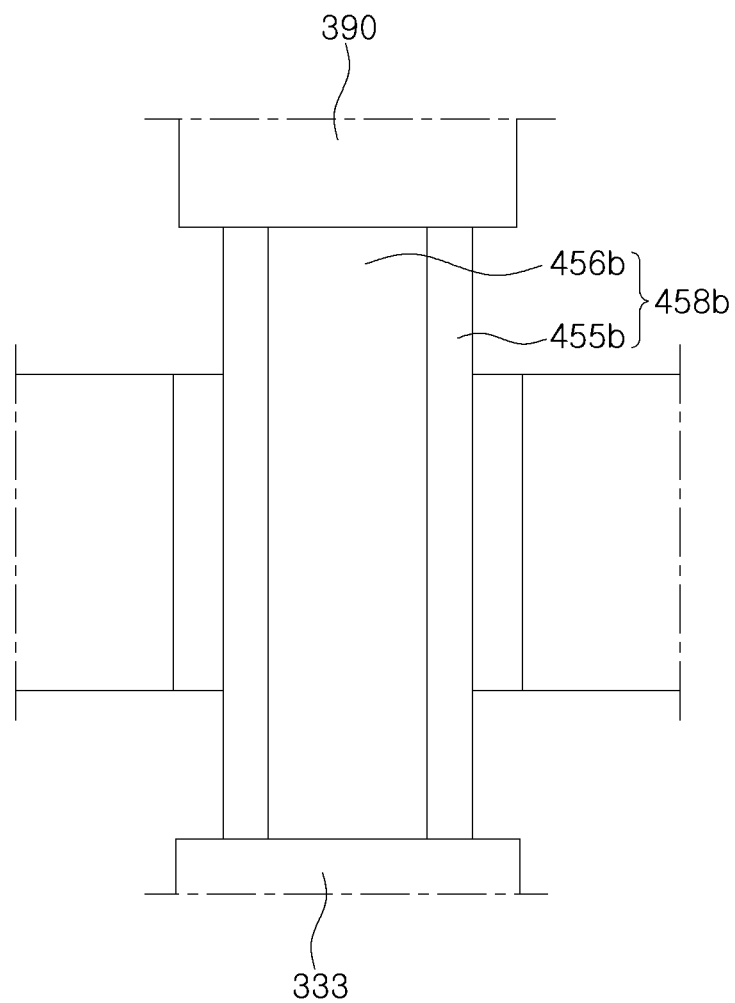
FIG. 8D is a partially enlarged view schematically illustrating a modified example of a semiconductor device according to an embodiment.

According to an embodiment, referring to FIG. 8D, the vertical channel structure 458*a* described in FIG. 8C may be replaced with a vertical channel structure 458*b* as illustrated in FIG. 8D. The vertical channel structure 458*b* may include a lower layer 455*b* and an upper layer 456*b*. The upper layer 456*b* may have a columnar shape, and the lower layer 455*b* may be on and, for example, may cover a side surface of the upper layer 456*b*. Lower surfaces of the lower layer 455*b* and the upper layer 456*b* may contact the bit line 333. The lower layer 455*b* may be formed of the same material as that of the lower layer 255 described with reference to FIG. 6A, and the upper layer 456*b* may be formed of the same material as that of the upper layer 256 described with reference to FIG. 6A.

Figure 9:
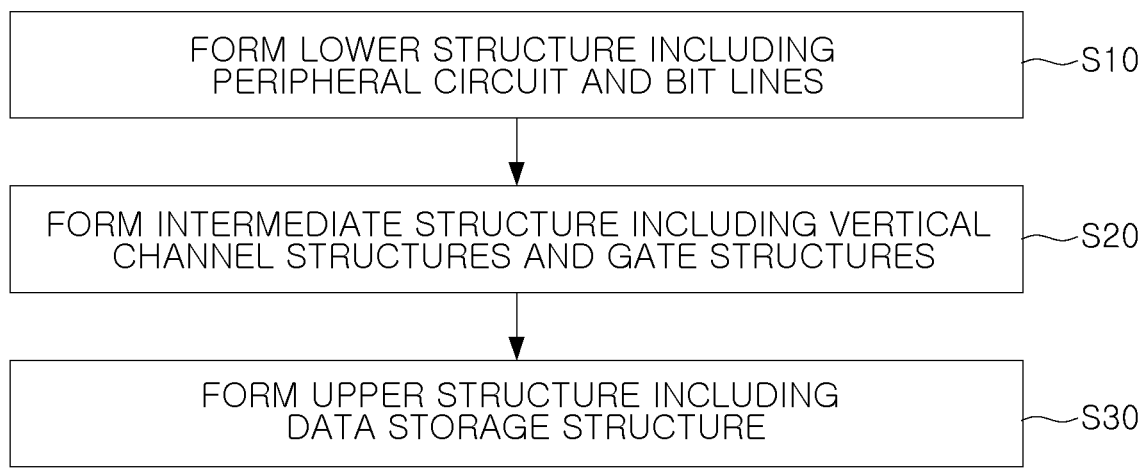
FIG. 9 is a flowchart schematically illustrating a process of a method of manufacturing a semiconductor device according to embodiments.

Next, a method of manufacturing a semiconductor device according to embodiments will be described with reference to FIG. 9 along with FIGS. 1, 2A, 2B, and 3. FIG. 9 is a flowchart schematically illustrating a sequential process of a method of manufacturing a semiconductor device according to embodiments.

Referring to FIG. 9 along with FIGS. 1, 2A, 2B, and 3, the lower structure LS including peripheral circuits and bit lines 33 may be formed (S10). The peripheral circuit may include the circuit element 9 described with reference to FIGS. 1, 2A, and 2B.

The intermediate structure MS including vertical channel structures and gate structures may be formed (S20). Each of the vertical channel structures may be formed as a U-shaped vertical channel structure as illustrated in FIGS. 1, 2A, 2B, and 3 (58 in FIGS. 1, 2A, 2B, and 3) or a columnar vertical channel structure 358 as illustrated in FIGS. 7A to 7C.

The upper structure US including a data storage structure may be formed (S30). In the upper structure US, the data storage structure may be formed as the data storage structure 90 of a memory such as DRAM as in FIGS. 1, 2A, and 2B, but the data storage structure may also be formed as a data storage structure of a memory other than DRAM.

As described above, a semiconductor device including a vertical channel structure including different layers may be provided. In the vertical channel structure, a first layer may include an oxide semiconductor layer or a 2D material layer having high mobility, and a second layer different from the first layer may include a material layer with high thermal stress and/or electrical stress or with high reliability. Accordingly, a semiconductor device having excellent reliability and/or performance may be provided.

According to embodiments, the semiconductor device including the vertical channel structure including different layers may be provided. In the vertical channel structure, the first layer may include an oxide semiconductor layer or a 2D material layer having high mobility, and the second layer different from the first layer may include a material layer with high thermal stress and/or electrical stress or with high reliability. Accordingly, the semiconductor device having excellent reliability and/or performance may be provided.

While aspects of embodiments have been shown and described above, it will be apparent to those skilled in the art that modifications and variations could be made without departing from the scope as defined by the appended claims.

What is claimed is:
1. A semiconductor device comprising:
a lower structure comprising bit lines;
an intermediate structure on the lower structure, and comprising a plurality of vertical channel structures and a plurality of gate structures; and
an upper structure on the intermediate structure and comprising a data storage structure,
wherein a first channel structure among the plurality of vertical channel structures comprises a lower portion, a first vertical portion extending upwardly from a first side of the lower portion, and a second vertical portion extending upwardly from a second side of the lower portion, the plurality of gate structures comprise a first gate structure and a second gate structure on the lower portion of the first channel structure between the first vertical portion and the second vertical portion, the first gate structure is in contact with the first vertical portion, the second gate structure is in contact with the second vertical portion, the first channel structure comprises a plurality of layers, and at least one of the plurality of layers is an oxide semiconductor layer or a two-dimensional (2D) material layer having an energy band gap of about 1.2 eV or greater.

2. The semiconductor device of claim 1, further comprising a conductive shielding pattern between the bit lines.

3. The semiconductor device of claim 1, wherein the plurality of vertical channel structures are respectively provided between adjacent first insulating patterns of the intermediate structure, a second insulating pattern of the intermediate structure is on the lower portion of the first channel structure between the first vertical portion and the second vertical portion of the first channel structure, and the second insulating pattern is between the first gate structure and the second gate structure.

4. The semiconductor device of claim 1, wherein the intermediate structure further comprises a first contact pattern on the first vertical portion and a second contact pattern on the second vertical portion, the first contact pattern and the second contact pattern are spaced apart from each other, and the data storage structure comprises electrodes in contact with each of the first contact pattern and the second contact pattern.

5. The semiconductor device of claim 1, wherein the plurality of layers comprise a first oxide semiconductor layer doped with an element X, and a second oxide semiconductor layer having a higher content, than that of the first oxide semiconductor layer, of at least one of In, Sn, Bi, W, or H, and the element X comprises at least one of Si, Nb, Ta, Y, N, F, or Mg.

6. The semiconductor device of claim 1, wherein the first channel structure comprises a first oxide semiconductor layer, a second oxide semiconductor layer, and a third oxide semiconductor layer that are sequentially stacked, and the second oxide semiconductor layer has a composition that is different from that of the first oxide semiconductor layer and the third oxide semiconductor layer.

7. The semiconductor device of claim 6, wherein the second oxide semiconductor layer has a higher content of at least one of In, Sn, Bi, W, or H than at least one of the first oxide semiconductor layer and the third oxide semiconductor layer.

8. The semiconductor device of claim 6, wherein the first oxide semiconductor layer is doped with an element X, the third oxide semiconductor layer is doped with an element Y, the element X comprises at least one of Si, Nb, Ta, Y, N, F, or Mg, and the element Y comprises at least one of Si, Nb, Ta, Y, N, F, or Mg.

9. The semiconductor device of claim 6, wherein each of the first gate structure and the second gate structure comprises a gate electrode and a gate dielectric layer between the gate electrode and the first channel structure, and the third oxide semiconductor layer is in contact with the gate dielectric layer.

10. The semiconductor device of claim 6, wherein the first oxide semiconductor layer has a thickness of about 0.1 nm to about 20 nm, the second oxide semiconductor layer has a thickness of about 0.1 nm to about 20 nm, and the third oxide semiconductor layer has a thickness of about 0.1 nm to about 20 nm.

11. The semiconductor device of claim 6, wherein the second oxide semiconductor layer is thicker than the first oxide semiconductor layer and the third oxide semiconductor layer.

12. The semiconductor device of claim 1, wherein the first channel structure comprises a first oxide semiconductor layer, a second oxide semiconductor layer, and a metal oxide layer, and the second oxide semiconductor layer and the first oxide semiconductor layer have different compositions.

13. The semiconductor device of claim 1, wherein the first channel structure comprises a first oxide semiconductor layer and a second oxide semiconductor layer that are sequentially stacked, the first oxide semiconductor layer is doped with an element X, the element X comprises at least one of Si, Nb, Ta, Y, N, F, or Mg, and the second oxide semiconductor layer has a higher content of at least one of In, Sn, Bi, W, or H than the first oxide semiconductor layer.

14. The semiconductor device of claim 13, wherein the first oxide semiconductor layer and the second oxide semiconductor layer have different thicknesses.

15. The semiconductor device of claim 1, wherein the first channel structure further comprises a metal oxide layer.

16. The semiconductor device of claim 1, wherein the first channel structure comprises:

an amorphous oxide semiconductor layer, and a crystalline oxide semiconductor layer or a spinel-phase oxide semiconductor layer.

17. A semiconductor device comprising:

a lower structure comprising a bit line extending in a first direction;

an intermediate structure on the lower structure, and comprising a vertical channel structure and a gate structure; and an upper structure on the intermediate structure and comprising a data storage structure, wherein the vertical channel structure comprises a lower portion and a vertical portion extending upwardly from a side of the lower portion, the gate structure is on the lower portion, and comprises a gate electrode extending in a second direction, perpendicular to the first direction, and a gate dielectric layer between the gate electrode and the vertical portion, the vertical channel structure comprises a first layer and a second layer, the first layer is a first oxide semiconductor layer or a two-dimensional (2D) material layer having an energy band gap of about 1.2 eV or greater, and the second layer is a metal oxide layer or a second oxide semiconductor layer having a composition different from that of the first oxide semiconductor layer of the first layer.

18. The semiconductor device of claim 17, wherein the vertical channel structure further comprises a third layer that is a third oxide semiconductor layer having a composition that is different from that of the first layer or the second layer.

19. A semiconductor device comprising:

a lower structure comprising a bit line;

an intermediate structure on the lower structure, and comprising a vertical channel structure and a gate structure in contact with a side surface of the vertical channel structure; and an upper structure on the intermediate structure and comprising a data storage structure, wherein the gate structure comprises a gate electrode and a gate dielectric layer between the gate electrode and the vertical channel structure, the vertical channel structure comprises a first layer, a second layer and a third layer, and the first layer and the second layer have different compositions.

20. The semiconductor device of claim 19, wherein the second layer is between the first layer and the third layer, the second layer is thicker than each of the first layer and the third layer, at least one of the first layer and the second layer is an oxide semiconductor layer, the third layer is in contact with the gate dielectric layer, and the third layer is a metal oxide or an oxide semiconductor layer having a composition different from that of the oxide semiconductor layer of the second layer.

* * * * *